(12) United States Patent
Chuang et al.

(10) Patent No.: US 8,828,838 B2
(45) Date of Patent: Sep. 9, 2014

(54) LARGE DIMENSION DEVICE AND METHOD OF MANUFACTURING SAME IN GATE LAST PROCESS

(71) Applicant: Taiwan Semiconductor Manufacturing Company, Ltd., Hsin-Chu (TW)

(72) Inventors: Harry-Hak-Lay Chuang, Singapore (SG); Ming Zhu, Singapore (SG)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/083,956

(22) Filed: Nov. 19, 2013

(65) Prior Publication Data

US 2014/0065786 A1    Mar. 6, 2014

Related U.S. Application Data

(62) Division of application No. 13/160,096, filed on Jun. 14, 2011, now Pat. No. 8,592,945.

(51) Int. Cl.
   *H01L 21/20*  (2006.01)
(52) U.S. Cl.
   USPC .................. 438/393; 438/395; 257/E21.19

(58) Field of Classification Search
   USPC .............. 438/393, 595; 257/E21.19
   See application file for complete search history.

(56) References Cited

U.S. PATENT DOCUMENTS

| | | | |
|---|---|---|---|
| 6,063,659 A | 5/2000 | Le | |
| 6,066,537 A | 5/2000 | Poh | |
| 6,146,939 A | 11/2000 | Dasgupta | |
| 6,417,556 B1 | 7/2002 | Long et al. | |
| 6,777,304 B2 | 8/2004 | Assaderaghi et al. | |
| 6,828,223 B2 | 12/2004 | Chuang | |
| 7,030,497 B2 | 4/2006 | Chuang | |
| 7,154,182 B2 | 12/2006 | Chuang | |
| 7,407,835 B2 | 8/2008 | Chuang | |
| 8,039,924 B2 | 10/2011 | Furumiya et al. | |
| 8,084,803 B2 | 12/2011 | Kim | |
| 8,101,493 B2 | 1/2012 | Lee | |
| 8,368,136 B2 | 2/2013 | Chuang et al. | |
| 2010/0001332 A1* | 1/2010 | Chuang et al. | ............ 257/310 |
| 2012/0319238 A1 | 12/2012 | Chuang et al. | |

\* cited by examiner

*Primary Examiner* — Lex Malsawma
(74) *Attorney, Agent, or Firm* — Haynes and Boone, LLP

(57) ABSTRACT

An integrated circuit device and methods of manufacturing the same are disclosed. In an example, integrated circuit device includes a capacitor having a doped region disposed in a semiconductor substrate, a dielectric layer disposed over the doped region, and an electrode disposed over the dielectric layer. At least one post feature embedded in the electrode.

20 Claims, 40 Drawing Sheets

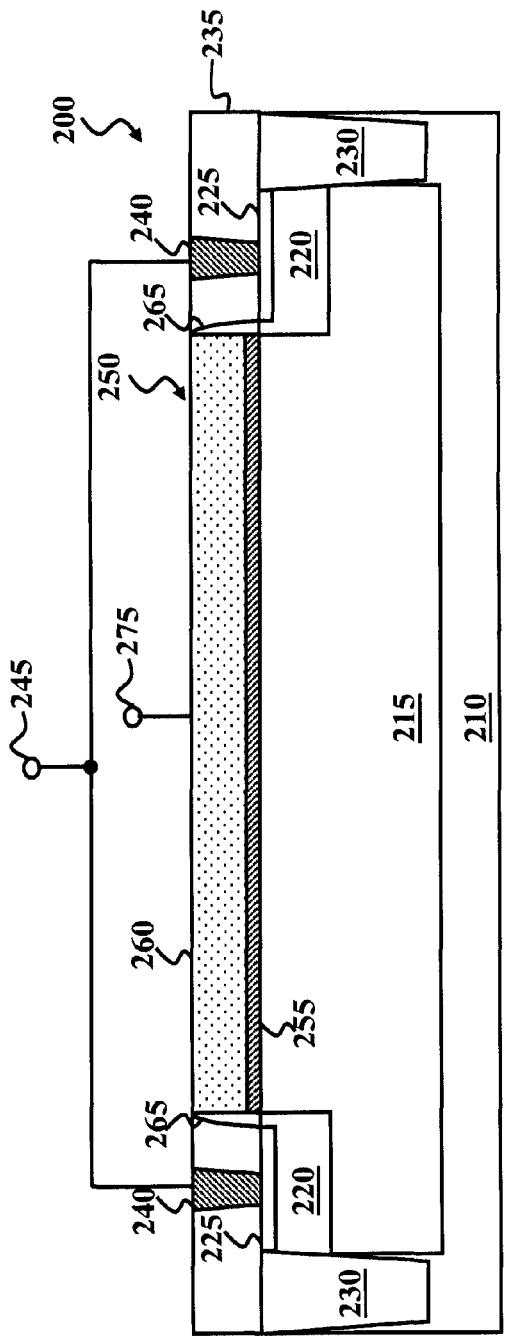

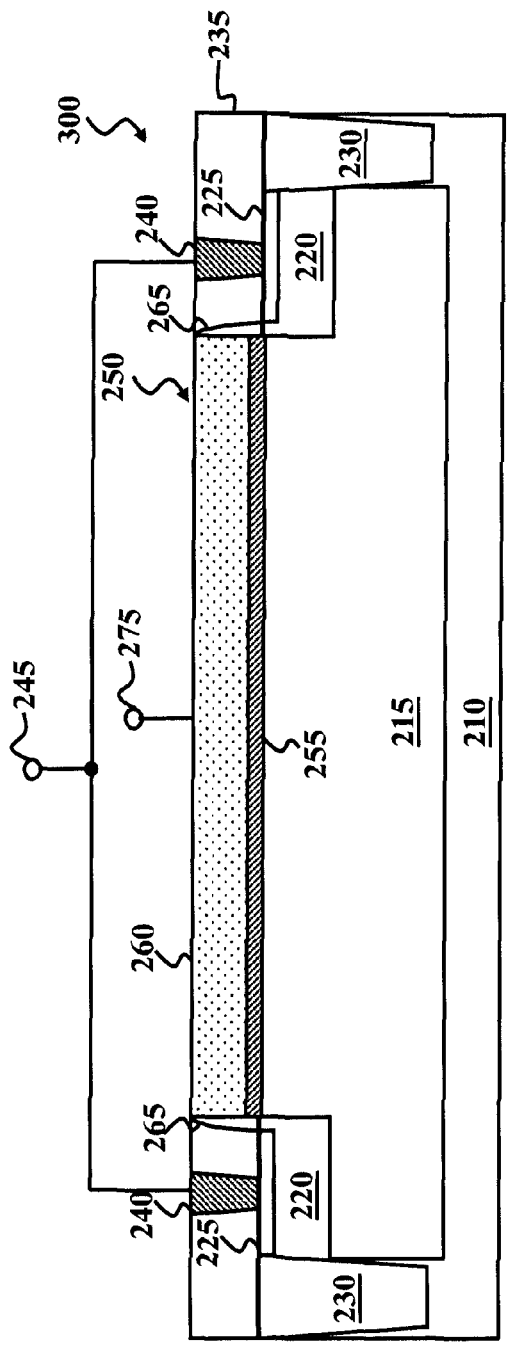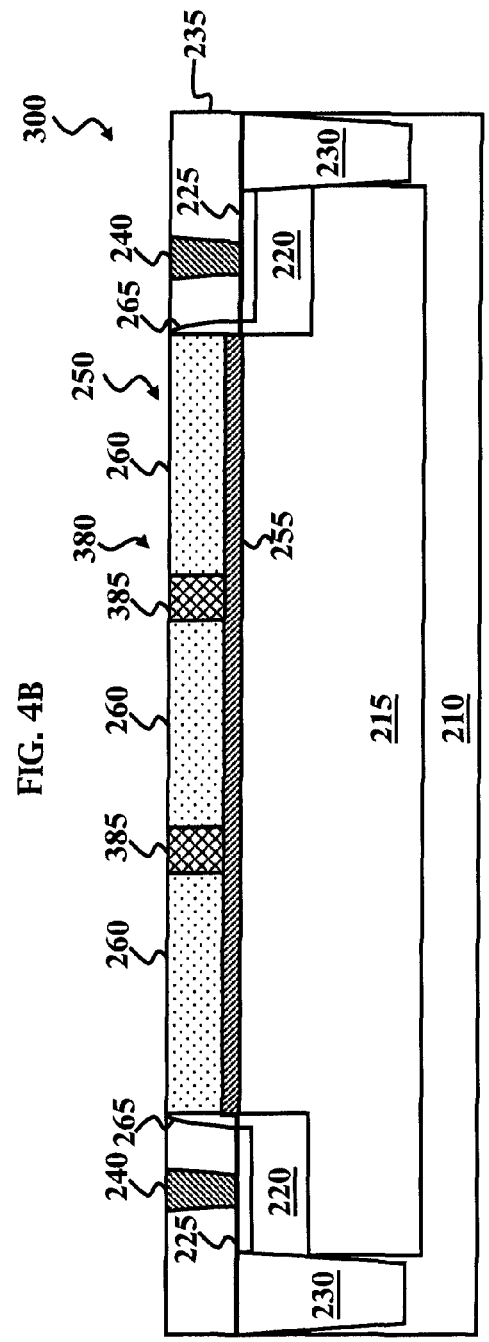
FIG. 4B
FIG. 4C

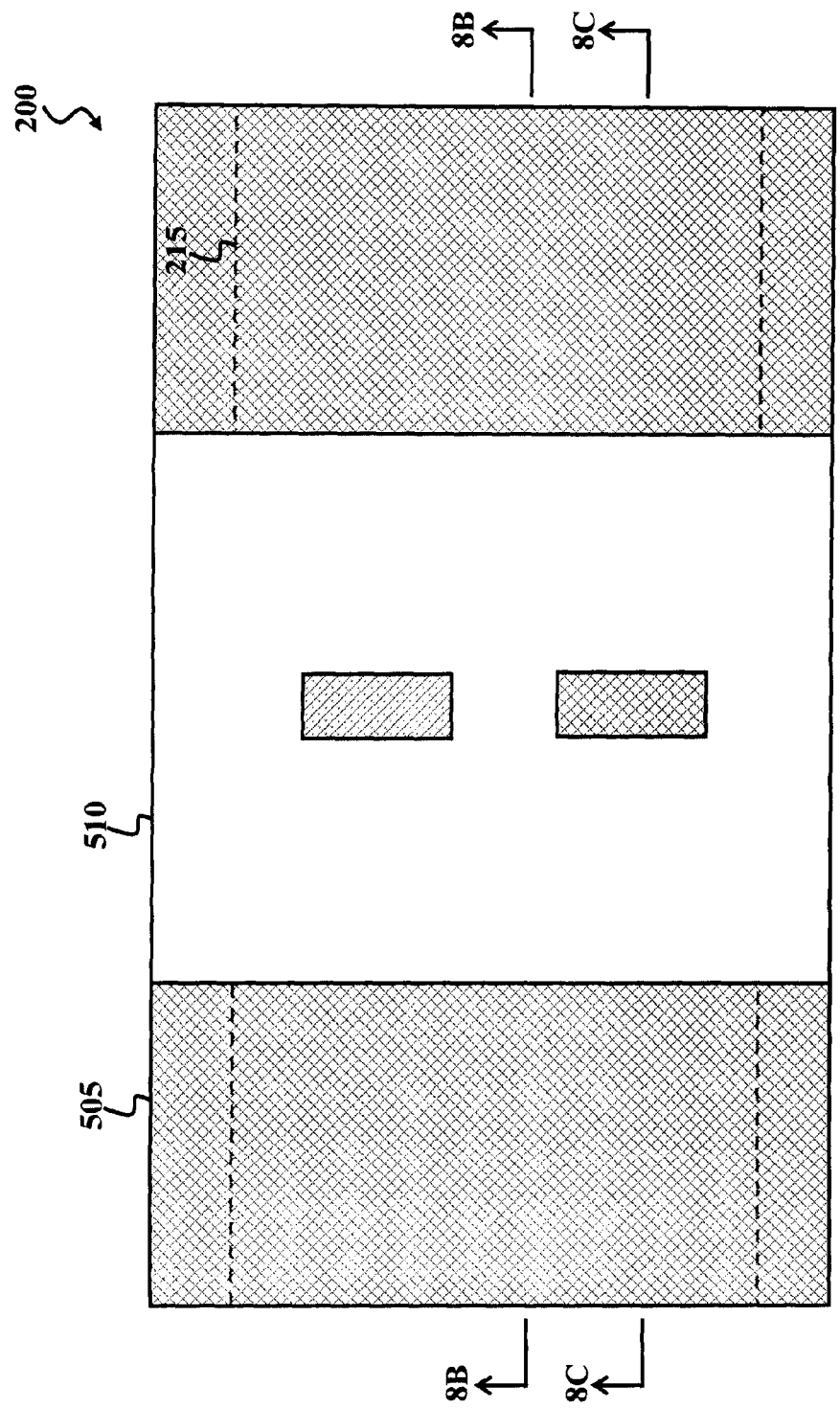

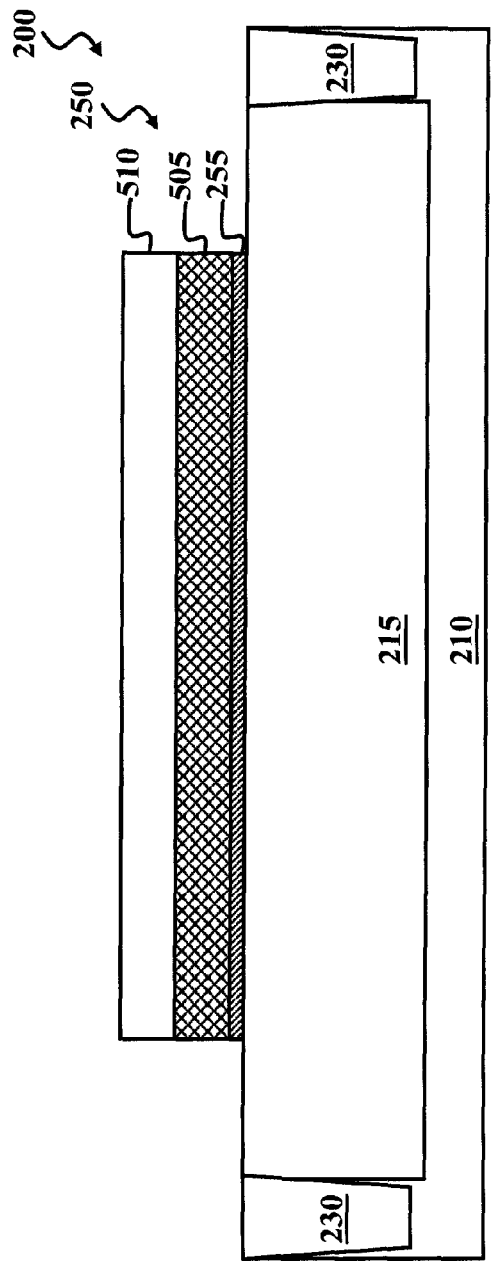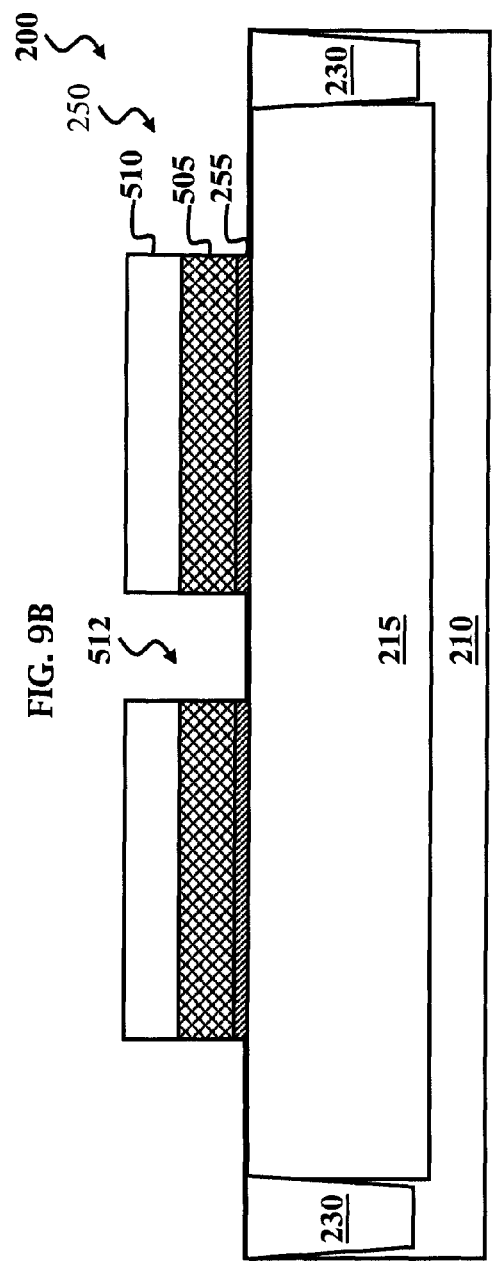

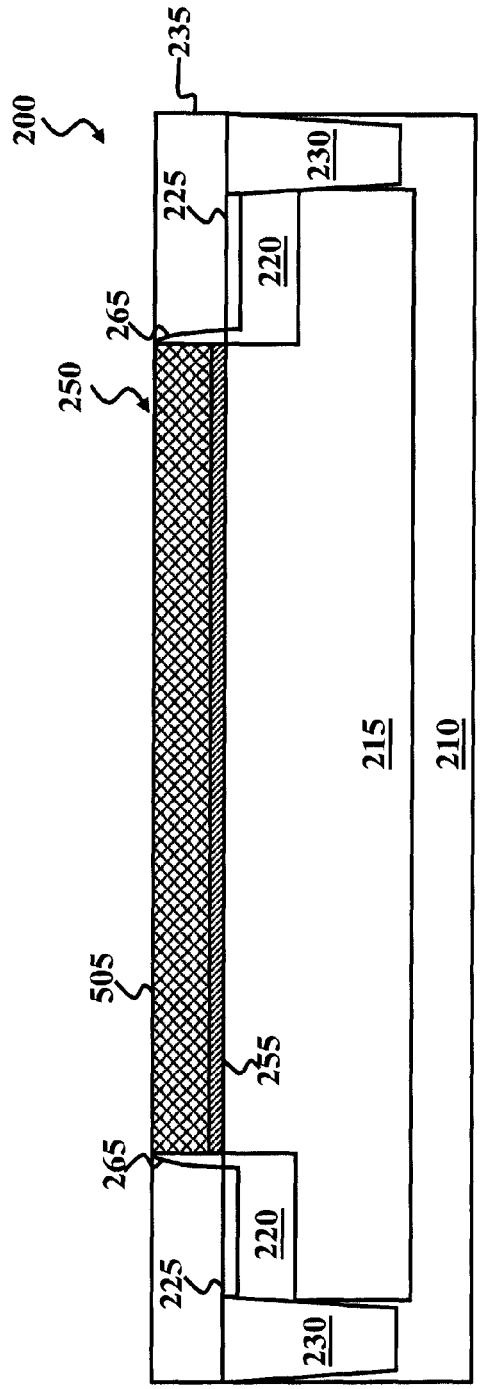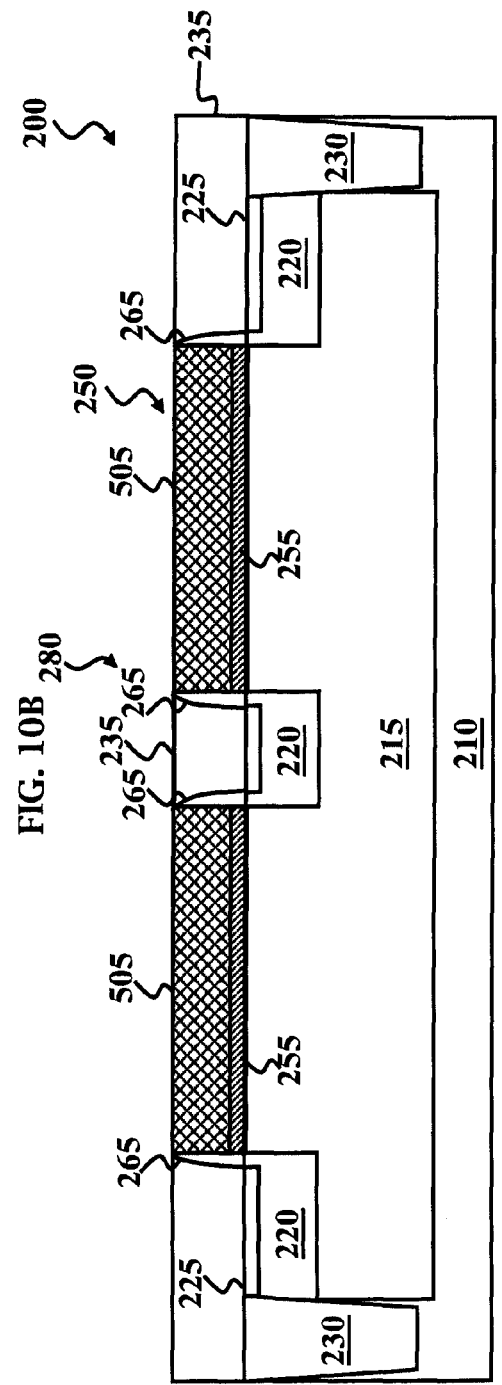
FIG. 10B
FIG. 10C

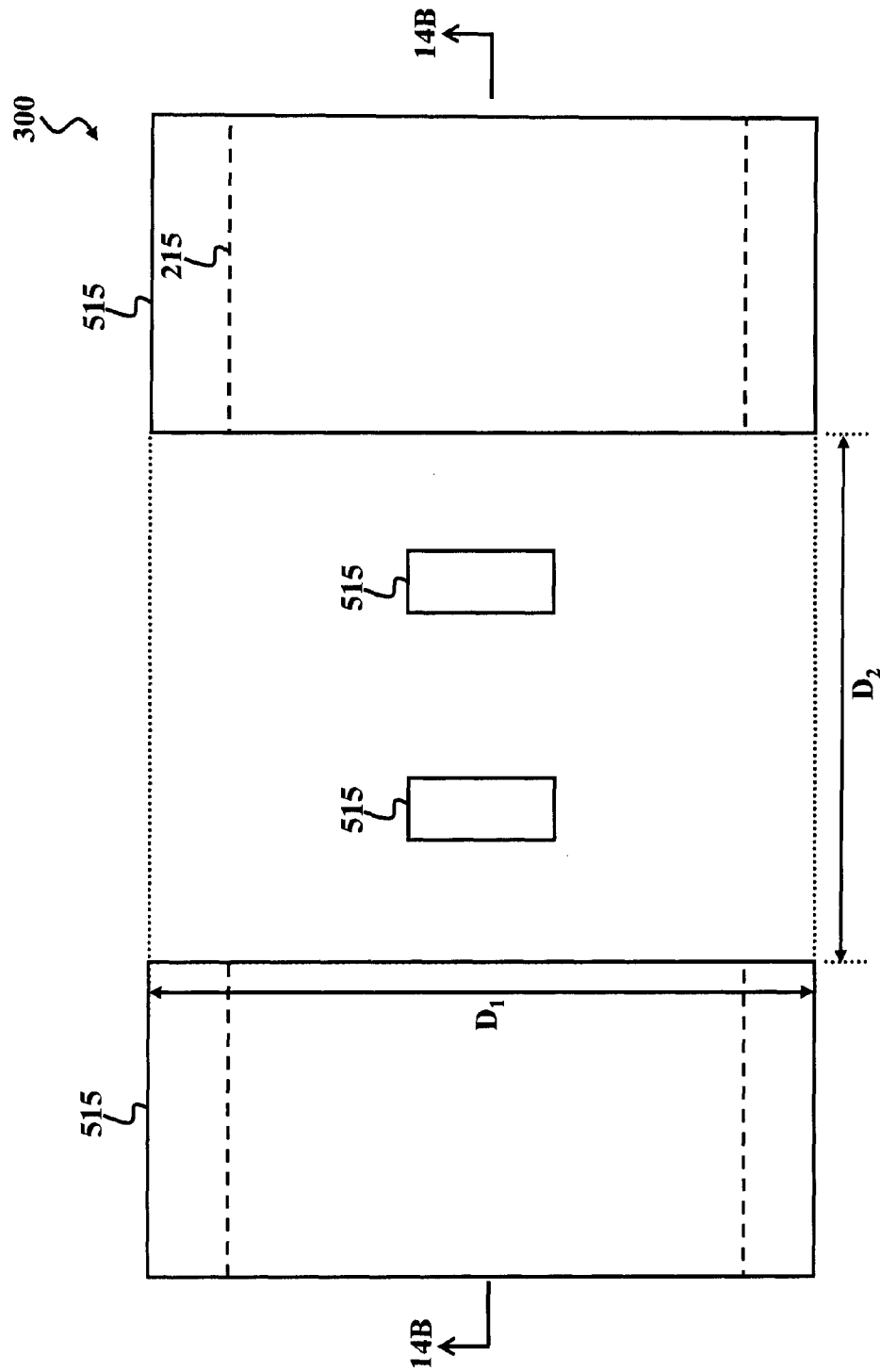

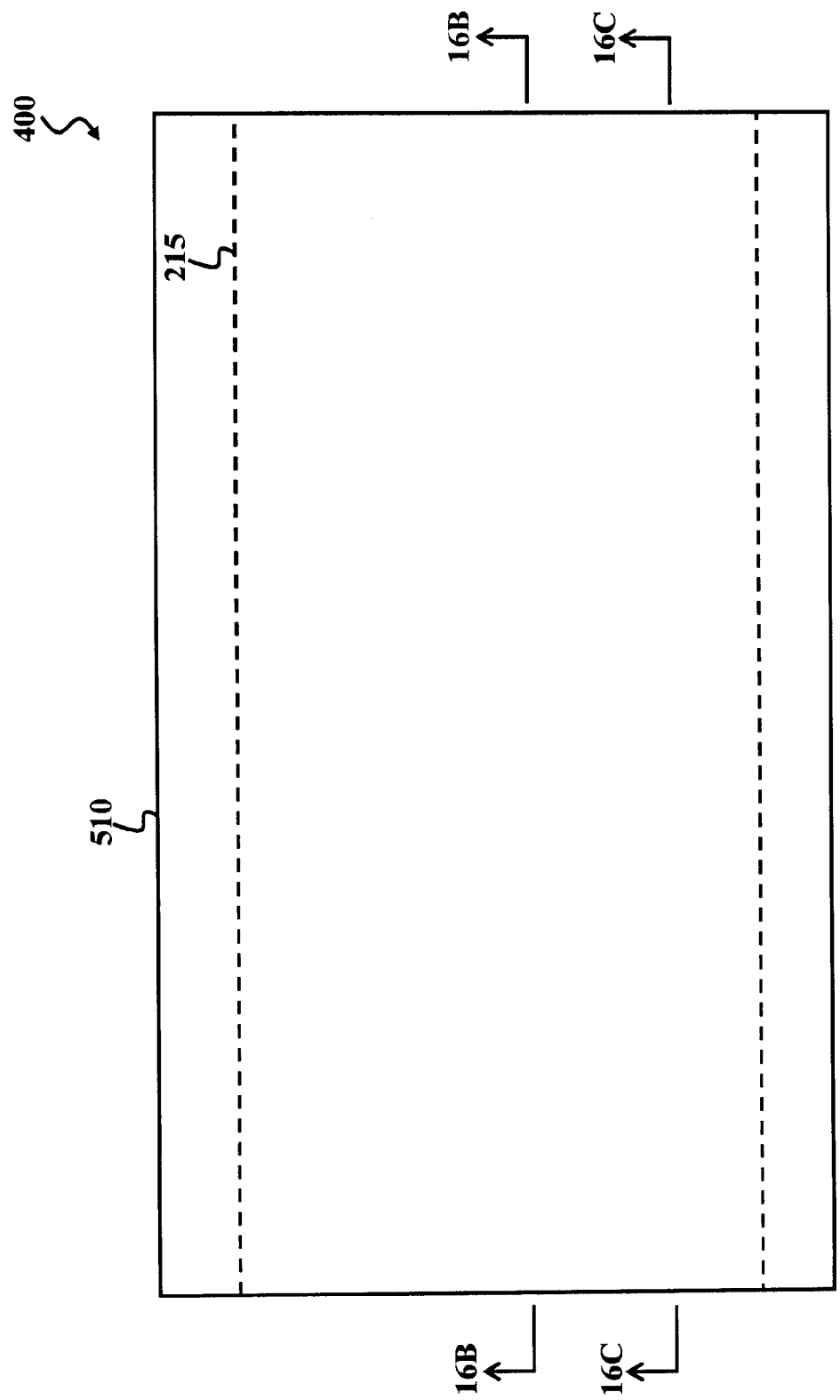

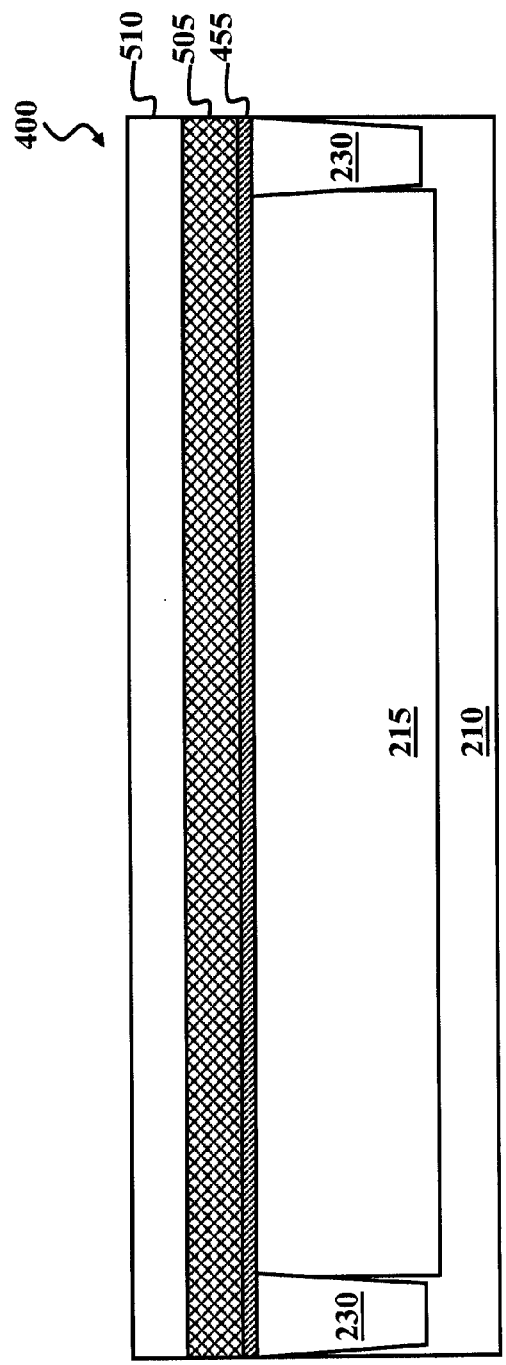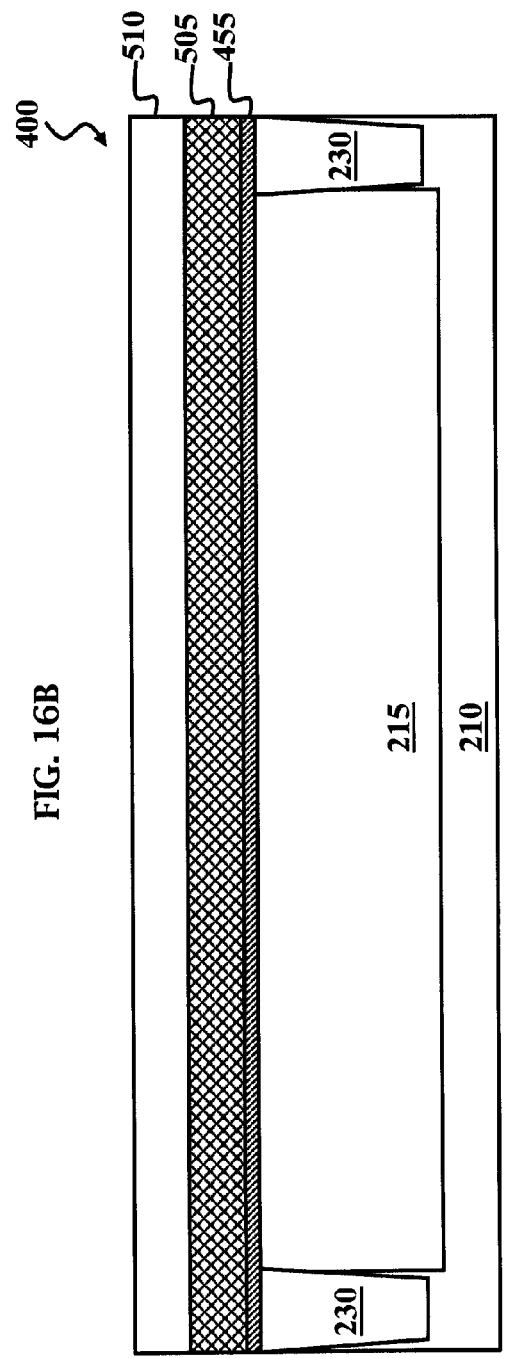

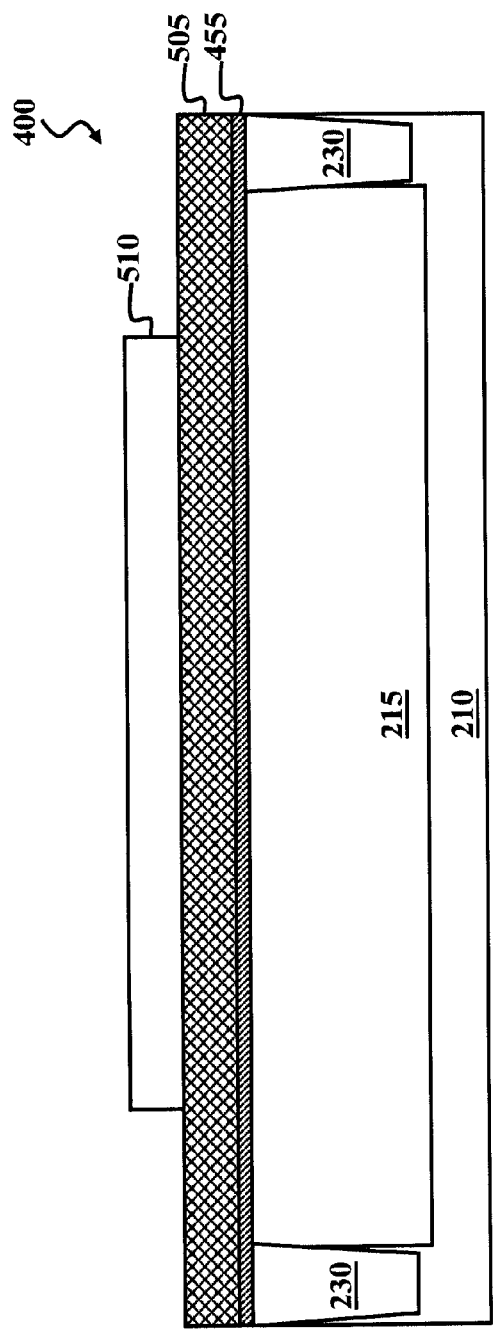
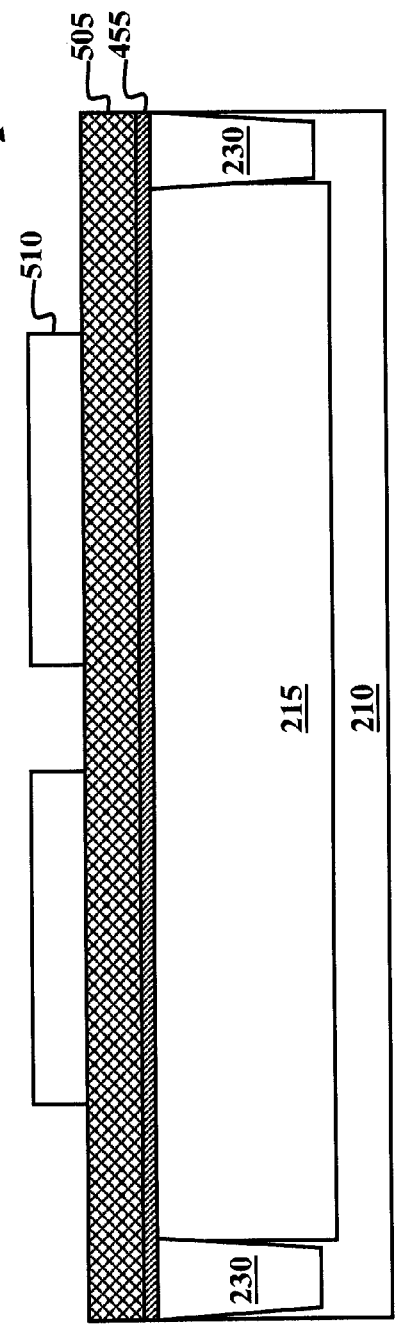
FIG. 18B
FIG. 18C

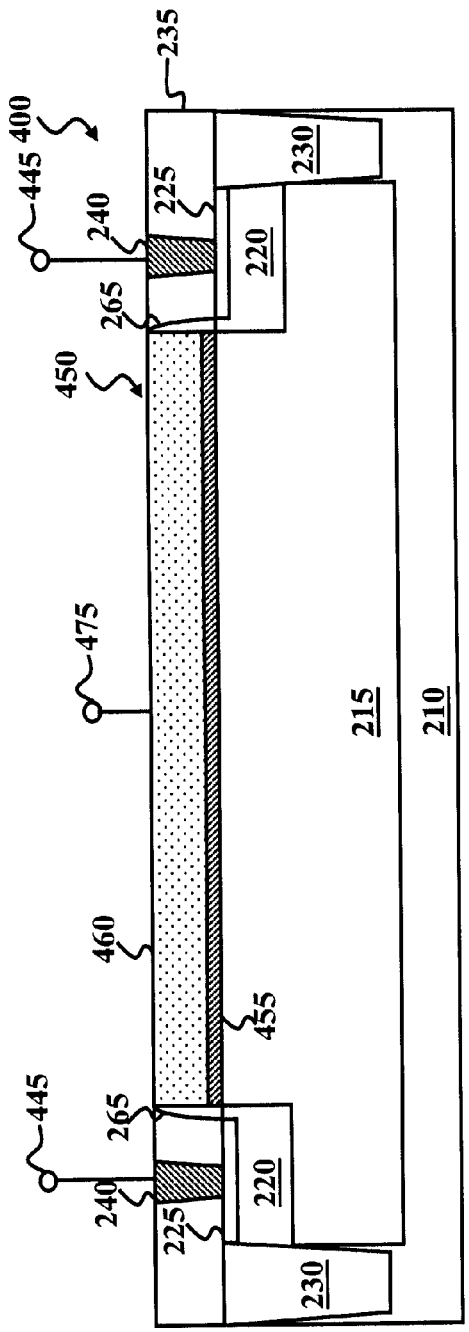
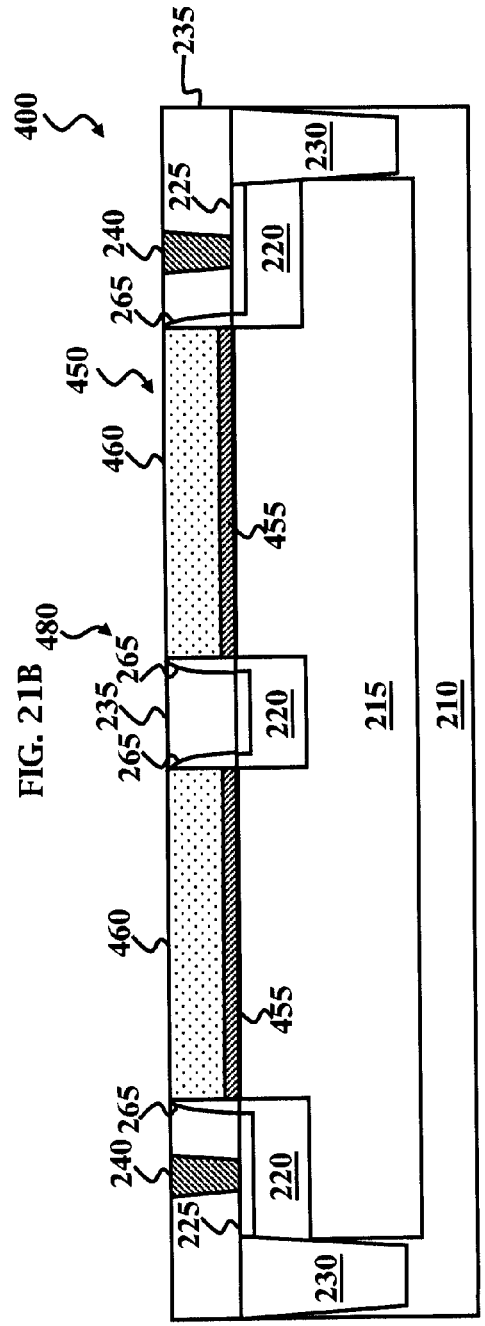
FIG. 21B
FIG. 21C

LARGE DIMENSION DEVICE AND METHOD OF MANUFACTURING SAME IN GATE LAST PROCESS

PRIORITY DATA

The present application is a divisional application of U.S. patent application Ser. No. 13/160,096, filed Jun. 14, 2011, which is incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2B is a diagrammatic cross-sectional view taken along line 2B-2B of the MOSCAP in FIG. 2A.

FIG. 2C is a diagrammatic cross-sectional view taken along line 2C-2C of the MOSCAP in FIG. 2A.

FIG. 4B is a diagrammatic cross-sectional view taken along line 4B-4B of the MOSCAP in FIG. 4A.

FIG. 4C is a diagrammatic cross-sectional view taken along line 4C-4C of the MOSCAP in FIG. 4A.

FIGS. 6A-11A are top views of the MOSCAP of FIGS. 2A-2C, in entirety or portion thereof, during various stages of fabrication.

FIGS. 6B-11B and 6C-11C are diagrammatic cross-sectional views, in entirety or portion thereof, of the MOSCAP in FIGS. 6A-11A, respectively.

FIGS. 12A-15A are top views of the MOSCAP of FIGS. 4A-4C, in entirety or portion thereof, during various stages of fabrication.

FIGS. 12B-15B are diagrammatic cross-sectional views, in entirety or portion thereof, of the MOSCAP in FIGS. 12A-15A, respectively.

FIGS. 16A-21A are top views of the transistor of FIGS. 4A-4C, in entirety or portion thereof, during various stages of fabrication.

FIGS. 16B-21B and 16C-21C are diagrammatic cross-sectional views, in entirety or portion thereof, of the transistor in FIGS. 6A-11A, respectively.

DETAILED DESCRIPTION

Figure 1:
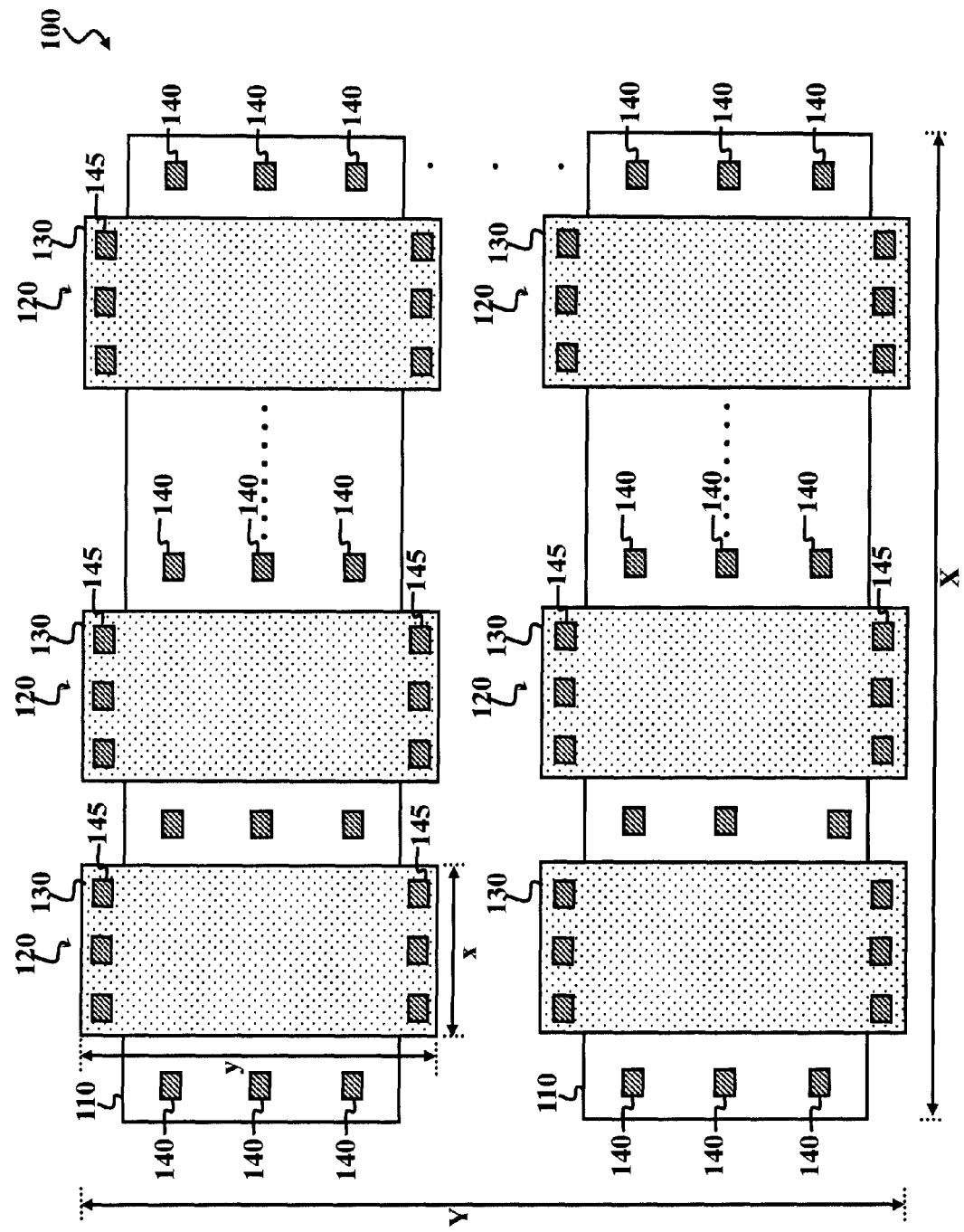
FIG. 1 is a top view of an integrated circuit device, in portion or entirety, according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a top view of an integrated circuit device 100, in portion or entirety, according to various aspects of the present disclosure. The integrated circuit device 100 is an integrated circuit (IC) chip, system on chip (SoC), or portion thereof, that includes various passive and active microelectronic devices such as resistors, capacitors, inductors, diodes, metal-oxide semiconductor field effect transistors (MOSFET), complementary metal-oxide semiconductor (CMOS) transistors, high voltage transistors, high frequency transistors, other suitable components, or combinations thereof. FIG. 1 has been simplified for the sake of clarity to better understand the inventive concepts of the present disclosure. Additional features can be added in the integrated circuit device 100, and some of the features described below can be replaced or eliminated for other embodiments of the integrated circuit device 100.

The integrated circuit device 100 includes at least one active region 110 on which the various passive and microelectronic devices of the integrated circuit device 100 are formed. The active regions 110 may be doped regions, such as n-type wells or p-type wells, disposed in a substrate (wafer), such as a silicon substrate. Typically, a boundary of the active regions 110 is defined by an insulator material, such as an oxide material. For example, the active regions 110 of the integrated circuit device 100 may be defined by isolation structures disposed in the substrate, such as shallow trench isolation (STI) features and/or local oxidation of silicon (LOCOS) features.

In the depicted embodiment, at least one metal-oxide-semiconductor capacitor (MOSCAP) 120 is disposed on the active regions 110. The MOSCAPs 120 have a semiconductor electrode (in the depicted embodiment, formed by the substrate), a metal electrode 130 (shown in the top view of FIG. 1), and a dielectric layer disposed between the semiconductor electrode and the metal electrode. The dielectric layer typically includes an oxide material, such as silicon oxide, thus leading to the capacitors 120 being referred to as MOSCAPs. Alternatively, other dielectric materials are used to form the dielectric layer of the MOSCAPs 120. Accordingly, though the capacitors 120 are referred to as MOSCAPs, it is understood that the capacitors may use any suitable dielectric material disposed between the electrodes of the capacitors 120, not necessarily oxide materials. Various contacts 140 and 145 are coupled with various portions of the MOSCAPs 120. The contacts 140 are coupled with portions of the MOSCAPs 120 in the active regions 110, and the contacts 145 are coupled with the metal electrode 130 of the MOSCAPs 120. The contacts 140 and 145 include a conductive material.

The MOSCAPs 120 are disposed in an array having a dimension X and a dimension Y, where the MOSCAP array covers an area X×Y of the integrated circuit device 100. The dimension X is greater than about 100 µm. The dimension Y is greater than or equal to about 3 µm. In an example, the MOSCAP array covers an area of about 300 µm×20 µm. Further, each MOSCAP 120 is considered a large area MOSCAP having a dimension x and a dimension y. In the depicted embodiment, the dimension x ranges from about 0.5 µm to about 1 µm, and the dimension y ranges from about 3 µm to about 6 µm. Other dimensions for the MOSCAPs 120 provide a "large area MOSCAP" depending on design requirements of the integrated circuit device 100.

Large area MOSCAPs 120 provide chip efficiency. Such MOSCAPs can provide noise isolation for power and signal transmission, or analog, digital signal processor (DSP), and/or radio frequency (RF) designs. A problem for large area MOSCAPs, such as MOSCAPs 120, arises when these MOSCAPs are fabricated in a gate last process, where a dummy gate structure (such as a dummy polysilicon gate) is formed first and then the dummy gate structure is removed and replaced with a metal gate structure (the metal electrode of the MOSCAP). For example, since the MOSCAPs consume a large area, dishing in the metal electrode sometimes arises during subsequent processing, such as during various chemical mechanical polishing (CMP) processes. Dishing leads to the MOSCAPs having lower than desirable gate heights (height of the MOSCAPs metal electrode). This dishing can also cause shifts in the metal electrode's work function, which can lead to a shift in capacitance-voltage (C-V) characteristics of the MOSCAP. Depth of focus (DOF) in a metal interconnect structure coupled with various portions of the MOSCAP can also be degraded, resulting in poor device yield. The following discussion provides various MOSCAP structures that can be implemented to reduce dishing that occurs during fabrication of the MOSCAP structure.

Figure 2A:
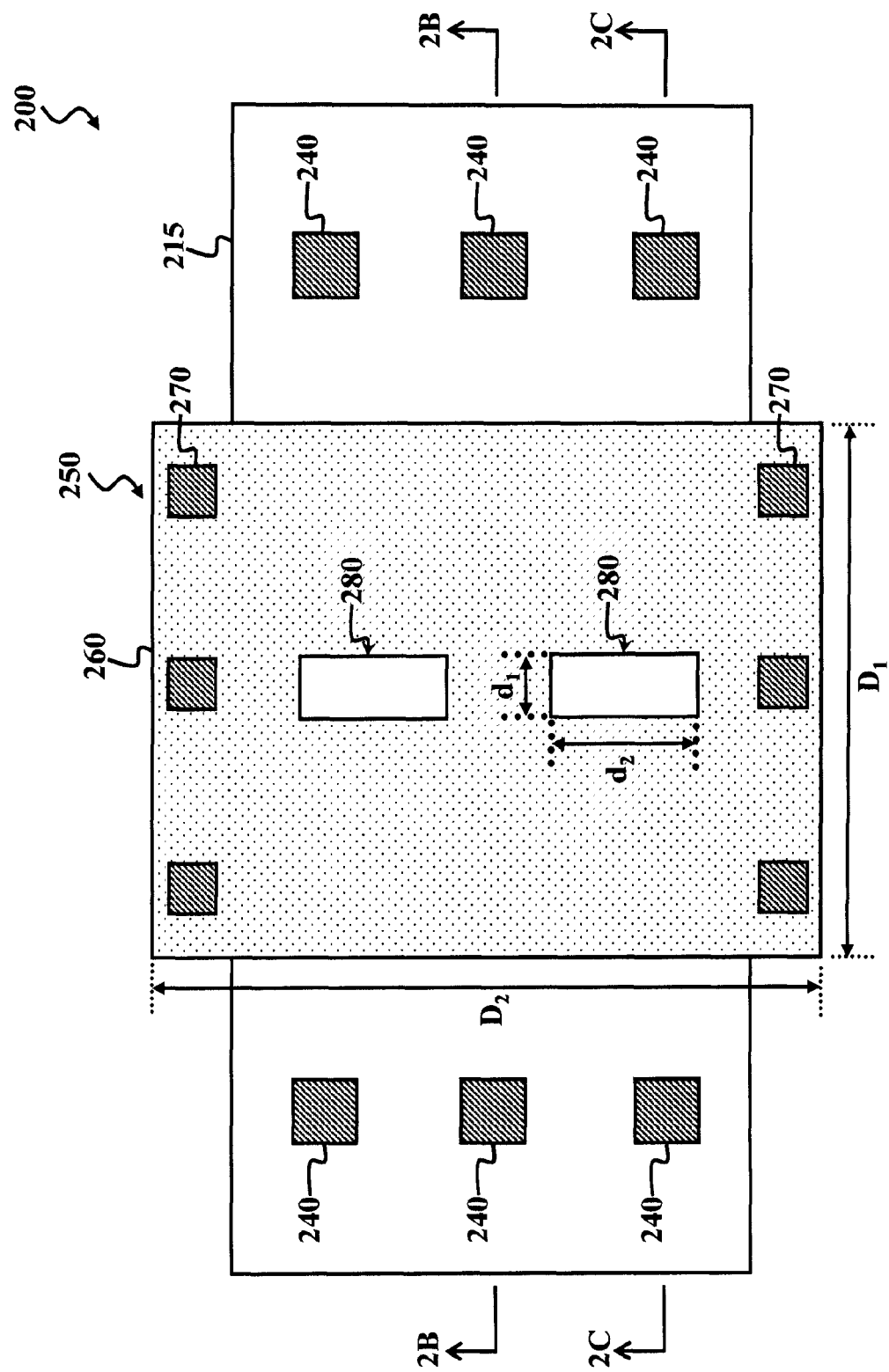
FIG. 2A is a top view of an embodiment of a metal-oxide-semiconductor capacitor (MOSCAP), in portion or entirety, according to various aspects of the present disclosure.

FIG. 2A is a top view of an embodiment of a MOSCAP 200, in entirety or portion thereof, that can be included in the integrated circuit device of FIG. 1, for example, to replace the MOSCAP 120. FIG. 2B is a diagrammatic cross-sectional view, in entirety or portion thereof, taken along line 2B-2B of the MOSCAP 200 in FIG. 2A; and FIG. 2C is a diagrammatic cross-sectional view, in entirety or portion thereof, taken along line 2C-2C of the MOSCAP 200 in FIG. 2A. FIGS. 2A-2C will be discussed concurrently and have been simplified for the sake of clarity to better understand the inventive concepts of the present disclosure. Further, additional features can be added in the MOSCAP 200, and some of the features described below can be replaced or eliminated for other embodiments of the MOSCAP 200.

The MOSCAP 200 includes a substrate (wafer) 210. The substrate 210 serves as an electrode of the MOSCAP 200. In the depicted embodiment, the substrate 210 is a semiconductor substrate including silicon. Alternatively or additionally, the substrate 210 comprises another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The semiconductor substrate 210 may include a doped epi layer, a gradient semiconductor layer, and/or a semiconductor layer overlying another semiconductor layer of a different type, such as a silicon layer on a silicon germanium layer. In the depicted embodiment, the substrate 210 is a p-type doped silicon substrate. P-type dopants that the substrate 210 are doped with include boron, gallium, indium, other suitable p-type dopants, or combinations thereof. Because the depicted MOSCAP 200 includes a p-type doped substrate, doping configurations described below should be read consistent with a p-type doped substrate. The MOSCAP 200 may alternatively include an n-type doped substrate, in which case, the doping configurations described below should be read consistent with an n-type doped substrate (for example, read with doping configurations having an opposite conductivity). N-type dopants that the substrate 210 can be doped with include phosphorus, arsenic, other suitable n-type dopants, or combinations thereof.

The substrate 210 includes various doped regions (e.g., p-type wells or n-type wells) depending on design requirements of the MOSCAP 200. The doped regions may be doped with p-type dopants, such as boron or $BF_2$; n-type dopants, such as phosphorus or arsenic; or a combination thereof. The doped regions may be formed directly on the substrate 210, in a P-well structure, in a N-well structure, in a dual-well structure, or using a raised structure. The doped regions are formed by an ion implantation process, a diffusion process, other suitable process, or combinations thereof. In the depicted embodiment, the substrate 210 includes a doped region 215 and doped regions 220. The doped region 215 defines an active region of the substrate 210. The doped regions 220 can define a source region and a drain region, though the doped regions 220 do not function as source and drain regions. For example, the doped regions 220 of the MOSCAP 200 may be simultaneously formed with source and drain regions of a transistor of the integrated circuit device 100. In the depicted embodiment, the doped region 215 is a p-type well, and the doped regions 220 are n-type wells.

Silicide features 225 are coupled with the doped regions 220. The silicide features 225 include a metal silicide, such as nickel silicide, cobalt silicide, tungsten silicide, tantalum silicide, titanium silicide, platinum silicide, erbium silicide, palladium silicide, other suitable silicide, or combinations thereof. The silicide features 225 can be formed by a salicide process or other suitable process.

Isolation features 230 are disposed in the substrate 210. In the depicted embodiment, the isolation features 230 define a boundary of the doped (active) region 215. The isolation features 230 utilize isolation technology, such as local oxidation of silicon (LOCOS) and/or shallow trench isolation (STI), to define and electrically isolate the various regions, such as the doped (active) regions 215. In the depicted embodiment, the isolation features 230 are trenches, specifically shallow trench isolation trenches, that are filled with a dielectric material, such as silicon oxide, silicon nitride, silicon oxynitride, other suitable materials, or combinations thereof.

The isolation features 230 may be formed by any suitable process. As one example, forming an STI includes a photolithography process, etching a trench in the substrate (for example, by using a dry etching and/or wet etching), and filling the trench (for example, by using a chemical vapor deposition process) with one or more dielectric materials. For example, the filled trench may have a multi-layer structure, such as a thermal oxide liner layer filled with silicon nitride or silicon oxide.

A dielectric layer 235 is disposed over the substrate 210 that includes silicon oxide. It is noted that the dielectric layer 235 is not shown in FIG. 2A. Alternatively or additionally, the dielectric layer 235 includes silicon nitride, silicon oxynitride, TEOS oxide, phosphosilicate glass (PSG), borophosphosilicate glass (BPSG), fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other suitable materials, or combinations thereof. The dielectric layer 235 may be an interlayer (or inter-level) dielectric (ILD) layer. The dielectric layer 235 is formed by a suitable process. Thereafter, a chemical mechanical polishing process may be applied to the dielectric layer 235.

Contacts 240 extend through the dielectric layer 235 to couple with various features of the MOSCAP 200. For example, the contacts 240 are electrically coupled with the doped regions 220 via the silicide features 225. The contacts 240 include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. In an example, the contacts 240 are a portion of a multilayer interconnect (MLI) disposed over the substrate 210. The MLI is coupled to various components of the MOSCAP 200 and integrated circuit device 100, such that the various components are operable to function as specified by design requirements of the MOSCAP 200 and integrated circuit device 100, respectively. The MLI includes various conductive features, which may be vertical interconnects, such as contacts and/or vias, and/or horizontal interconnects, such as lines. The various conductive features include materials similar to the contacts 240. In the depicted embodiment, the doped regions 220 are coupled together via the contacts 240 (and silicide features 225) to form a terminal 245 of the MOSCAP 200. A voltage may be applied to the doped regions 220 via the terminal 245 during operation of the MOSCAP 200.

The MOSCAP 200 includes a material layer stack 250. The material layer stack 250 has a dimension $D_1$ and a dimension $D_2$. In the depicted embodiment, the dimension $D_1$ ranges from about 0.5 μm to about 1 μm, and the dimension $D_2$ ranges from about 3 μm to about 6 μm. The material layer stack 250 includes a dielectric layer 255 and an electrode 260. The dielectric layer 255 and the electrode 260 respectively serve as the dielectric material and the other electrode of the MOSCAP 200. The dielectric layer 255 includes a dielectric material, such as silicon oxide, high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. The electrode 260 includes polysilicon and/or a metal including Al, Cu, Ti, Ta, W, Mo, TaN, NiSi, CoSi, TiN, WN, TiAl, TiAlN, TaCN, TaC, TaSiN, other conductive materials, or combinations thereof. The material layer stack 250 may include numerous other layers, for example, capping layers, interfacial layers, diffusion layers, barrier layers, or combinations thereof. In an example, the material layer stack 250 includes an interfacial layer (such as a thermally grown oxide layer) disposed over the substrate 210, a high-k dielectric layer disposed over the interfacial layer, a barrier layer (such as a TiN layer) disposed over the high-k dielectric layer, and a metal layer (such as an aluminum layer) disposed over the high-k dielectric layer. It is noted that, in the depicted embodiment, the material layer stack 250 is similar to a gate stack of a transistor (for example, the dielectric layer 255 is similar to a gate dielectric layer of a transistor and the electrode 260 is similar to a gate electrode of the transistor). Accordingly, the material layer stack 250 may be simultaneously formed with a gate stack of a transistor.

The material layer stack 250 is formed by a process including deposition, lithography patterning, and/or etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable deposition methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable lithography patterning processes, or combinations thereof. Alternatively, the lithography exposing process is implemented or replaced by other methods, such as maskless photolithography, electron-beam writing, and/or ion-beam writing. In yet another alternative, the lithography patterning process could implement nanoimprint technology. The etching processes include dry etching, wet etching, and/or other etching methods.

Dielectric features 265 are disposed on sidewalls of the dielectric layer 255 and electrode 260 of the material layer stack 250. The dielectric features 265 comprise a dielectric material, such as silicon oxide, silicon nitride, silicon oxynitride, other suitable material, or combinations thereof. The dielectric features 265 may include a multi-layer structure, such as a multi-layer structure including a silicon nitride layer and a silicon oxide layer. The dielectric features 265 are formed by a suitable process to a suitable thickness. For example, dielectric features 265 may be formed by depositing silicon nitride and silicon oxide layers and then dry etching the layers to form the spacers. It is noted that the dielectric features 265 are similar to spacers disposed along sidewalls of a gate stack of a transistor. The dielectric features 265 may accordingly be formed simultaneously with spacers for the transistor, and thus, may also be referred to as spacers.

Contacts 270 extend through the dielectric layer 235 to couple with various features of the MOSCAP 200. For example, the contacts 270 are electrically coupled with the electrode 260 of the material layer stack 250. The contacts 270 include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. In an example, the contacts 270 are a portion of the MLI, described above, disposed over the substrate 210. In the depicted embodiment, the material layer stack 250 forms another terminal 275 of the MOSCAP 200. The terminal 275 may include the contacts 270 coupled with the material layer stack 250. A voltage may be applied to the material layer stack 250 via the terminal 275 during operation of the MOSCAP 200.

The MOSCAP 200 includes at least one post feature 280 disposed in the material layer stack 250. The post features 280 extend through the material layer stack 250, specifically through the electrode 260 and the dielectric layer 255 in the depicted embodiment. The post features 280 have a top surface that is substantially planar with a top surface of the material layer stack 250, such as the electrode 260. In the depicted embodiment, the post features 280 include a dielectric material. The dielectric material can include silicon oxide, silicon nitride, silicon oxynitride, other suitable material, or combinations thereof. For example, in the depicted embodiment, the post features 280 include a portion of the dielectric layer 235 and dielectric features (spacers) 265. The post features 280 can therefore be formed simultaneously with the dielectric layer 235 and the spacers 265.

Dimensions of the post features 280 are designed such that the post features 280 retard a polishing process, such as a chemical mechanical polishing process during fabrication of the MOSCAP 200, while contributing a minimum amount of capacitance loss. For example, the post features 280 are designed to cause less than about 6% capacitance loss in the MOSCAP 200. The post features 280 have a dimension $d_1$ and a dimension $d_2$. In the depicted embodiment, the dimension $d_1$ is greater than or equal to about 0.1 µm, and the dimension $d_2$ ranges from about 0.3 µm to about 1 µm. The dimension $d_1$ indicates a width of each post feature 280, and the dimension $d_2$ indicates a length of each post feature 280. In the depicted embodiment, the width ($d_1$) of the post features 280 extends in a direction that is substantially parallel to the width ($D_1$) of the material layer stack 250, and the length ($d_2$) of the post features 280 extends in a direction that is substantially parallel to the length ($D_2$) of the material layer stack 250.

Figure 3:
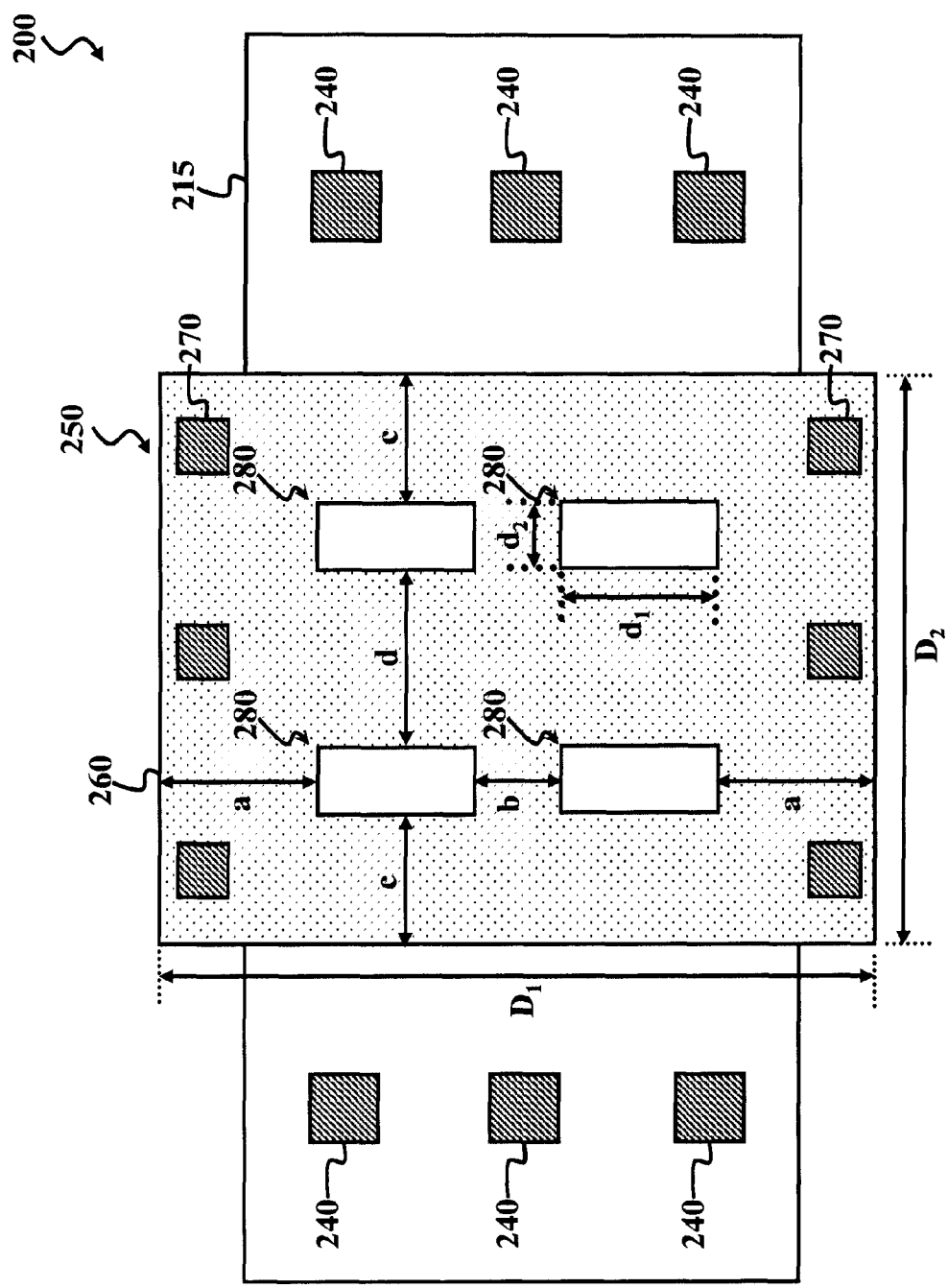
FIG. 3 is a top view of another embodiment of the MOSCAP of FIG. 2A.

In FIGS. 2A-2C, the MOSCAP 200, specifically the material layer stack 250 of the MOSCAP structure 200, includes two post features 280. Alternatively, more or less post features 280 may be included in the material layer stack 250. For example, FIG. 3 is another top view of an embodiment of the MOSCAP 200, in entirety or portion thereof, that can be included in the integrated circuit device of FIG. 1. In FIG. 3, the MOSCAP 200 includes four post features 280. Each post feature 280 has the dimension $d_1$ and the dimension $d_2$. Each post feature 280 is vertically spaced from a perimeter of the material layer stack 250 by a value represented by a, vertically spaced from another post feature 280 by a value represented by b, horizontally spaced from the perimeter of the material layer stack 250 by a value represented by c, and horizontally spaced from another post feature 280 by a value represented by d. In the depicted embodiment, each of the values a, b, c, and d is greater than or equal to about 0.5 µm. As noted above, the post features are designed to cause less than about 6% capacitance loss in the MOSCAP 200. In FIG. 3, a ratio of an area of the post features 280 to an area of the material layer stack 250 before the post features 280 are inserted is less than or equal to about XY/(0.6X+0.5)(0.8Y+0.5), where X is a number of rows of post features 380 in the post feature array, and Y is a number of columns of post features 380 in the post feature array. In an example, the ratio is less than or equal to about 1/16, or about 6.25%.

Figure 4A:
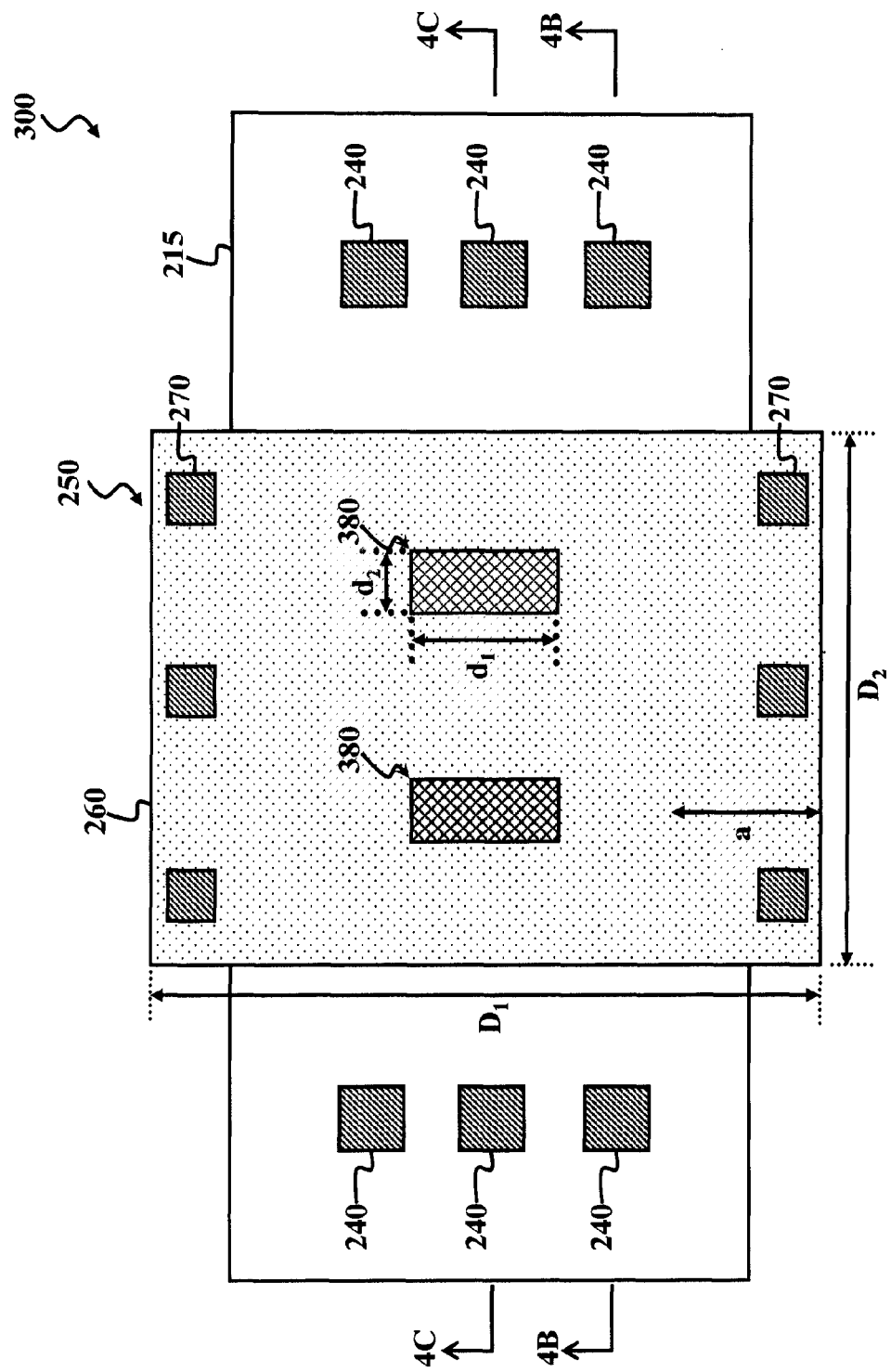
FIG. 4A is a top view of another embodiment of a MOSCAP, in portion or entirety, according to various aspects of the present disclosure.

FIG. 4A is a top view of an embodiment of a MOSCAP 300, in entirety or portion thereof, that can be included in the integrated circuit device of FIG. 1, for example, to replace the MOSCAP 120. FIG. 4B is a diagrammatic cross-sectional view, in entirety or portion thereof, taken along line 4B-4B of the MOSCAP 300 in FIG. 4A; and FIG. 4C is a diagrammatic cross-sectional view, in entirety or portion thereof, taken along line 4C-4C of the MOSCAP 300 in FIG. 4A. FIGS. 4A-4C will be discussed concurrently and have been simplified for the sake of clarity to better understand the inventive concepts of the present disclosure. The embodiment of FIGS. 4A-4C is similar in many respects to the embodiment of FIGS. 2A-2C. Accordingly, similar features in FIGS. 2A-2C and FIGS. 4A-4C are identified by the same reference numerals for clarity and simplicity. Additional features can be added in the MOSCAP 300, and some of the features described below can be replaced or eliminated for other embodiments of the MOSCAP 300.

The MOSCAP 300 includes at least one post feature 380 disposed in the material layer stack 250. In the depicted embodiment, the post features 380 extend through the electrode 260. Alternatively, the post features 380 may extend through the material layer stack 250, through the electrode 260 and the dielectric layer 255. The post features 380 have a top surface that is substantially planar with a top surface of the material layer stack 250, such as the electrode 260. In the depicted embodiment, the post features 380 include polysilicon features 385. Dimensions of the post features 380 are designed such that the post features 380 retard a polishing process, such as a chemical mechanical polishing process during fabrication of the MOSCAP 300, while contributing a minimum amount of capacitance loss. For example, the larger the post features 380, the more capacitance loss experienced in the MOSCAP 300. Accordingly, the dimension $d_1$ and the dimension $d_2$ are selected to achieve a minimum capacitance loss, while retarding polishing processes. In the depicted embodiment, the dimension $d_1$ is greater than or equal to about 600 nm, and the dimension $d_2$ is greater than or equal to about 200 nm. The dimension $d_1$ indicates a width of each post feature 280, and the dimension $d_2$ indicates a length of each post feature 380. In the depicted embodiment, the width ($d_1$) of the post features 380 extends in a direction that is substantially parallel to the width ($D_1$) of the material layer stack 250, and the length ($d_2$) of the post features 380 extends in a direction that is substantially parallel to the length ($D_2$) of the post features 380. Similar to the MOSCAP 200, more or less post features 380 may be included in the MOSCAP 300 than those illustrated in FIGS. 4A-4C.

Figure 5A:
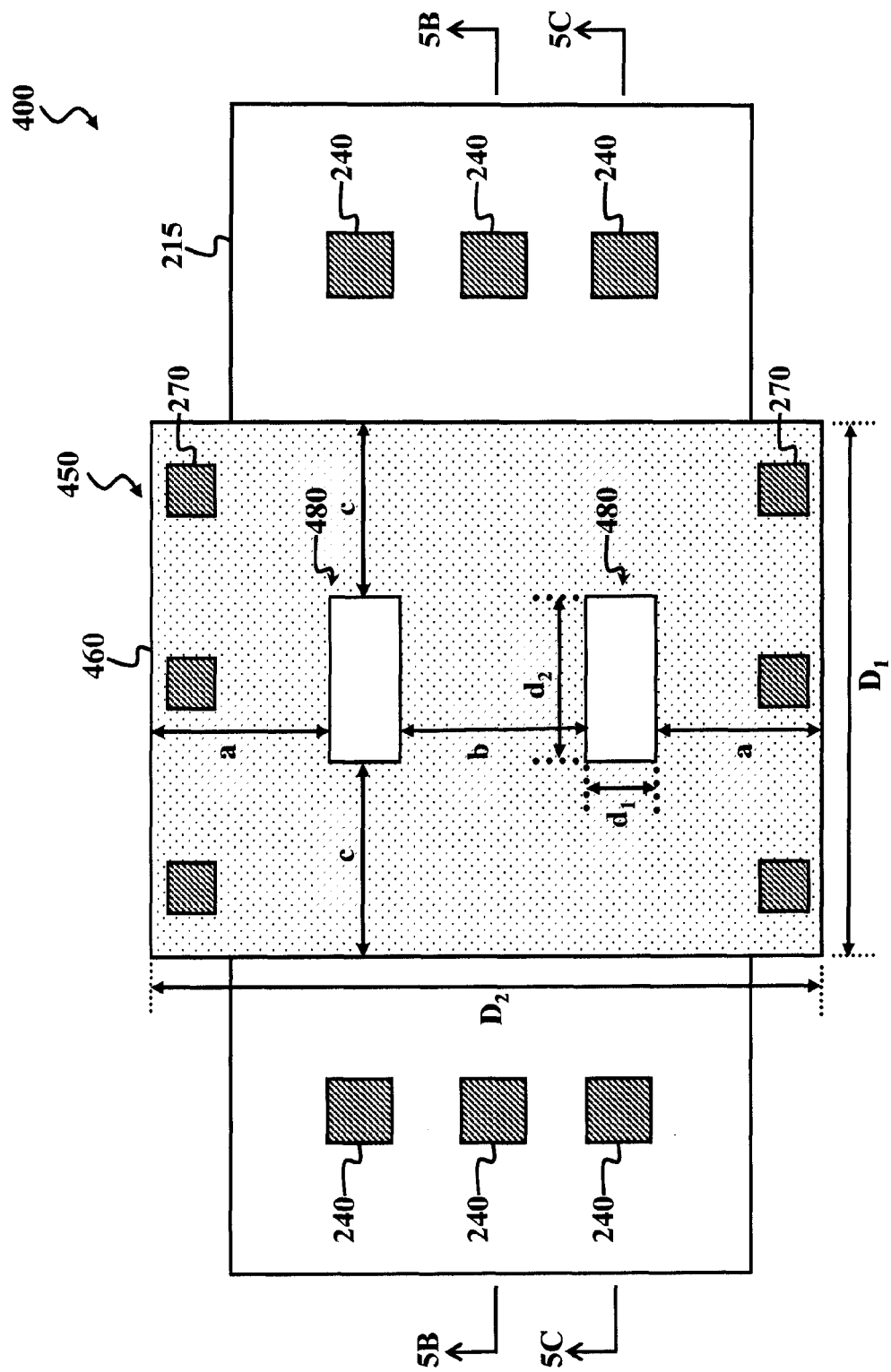
FIG. 5A is a top view of a transistor, in portion or entirety, according to various aspects of the present disclosure.
Figures 5B, 5C:
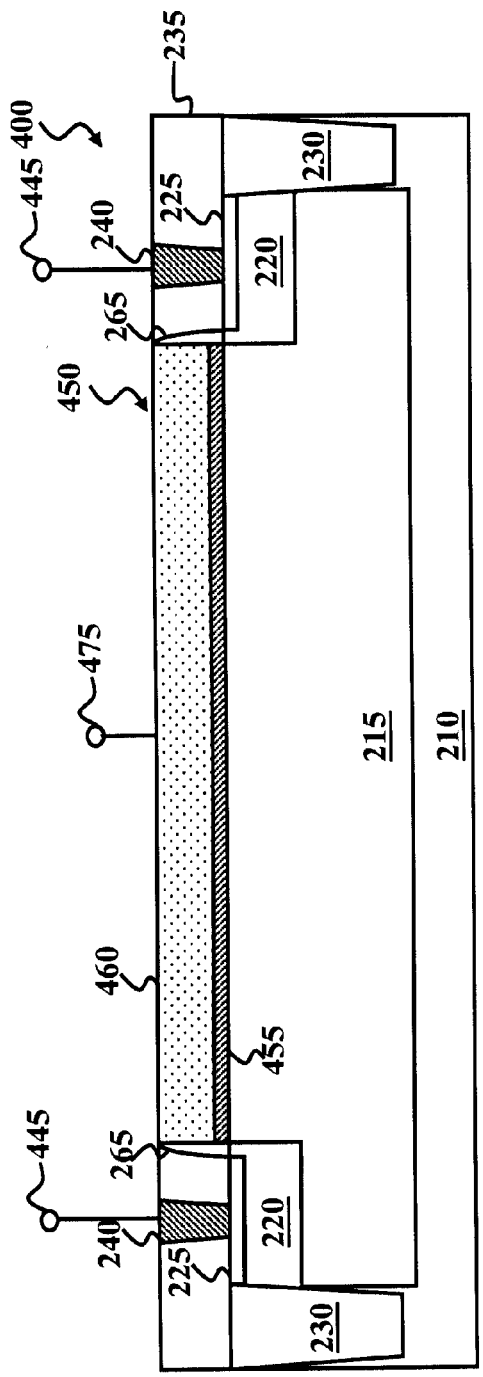
FIG. 5B is a diagrammatic cross-sectional view taken along line 5B-5B of the transistor in FIG. 5A.
FIG. 5C is a diagrammatic cross-sectional view taken along line 5C-5C of the transistor in FIG. 5A.
Figure 6A:
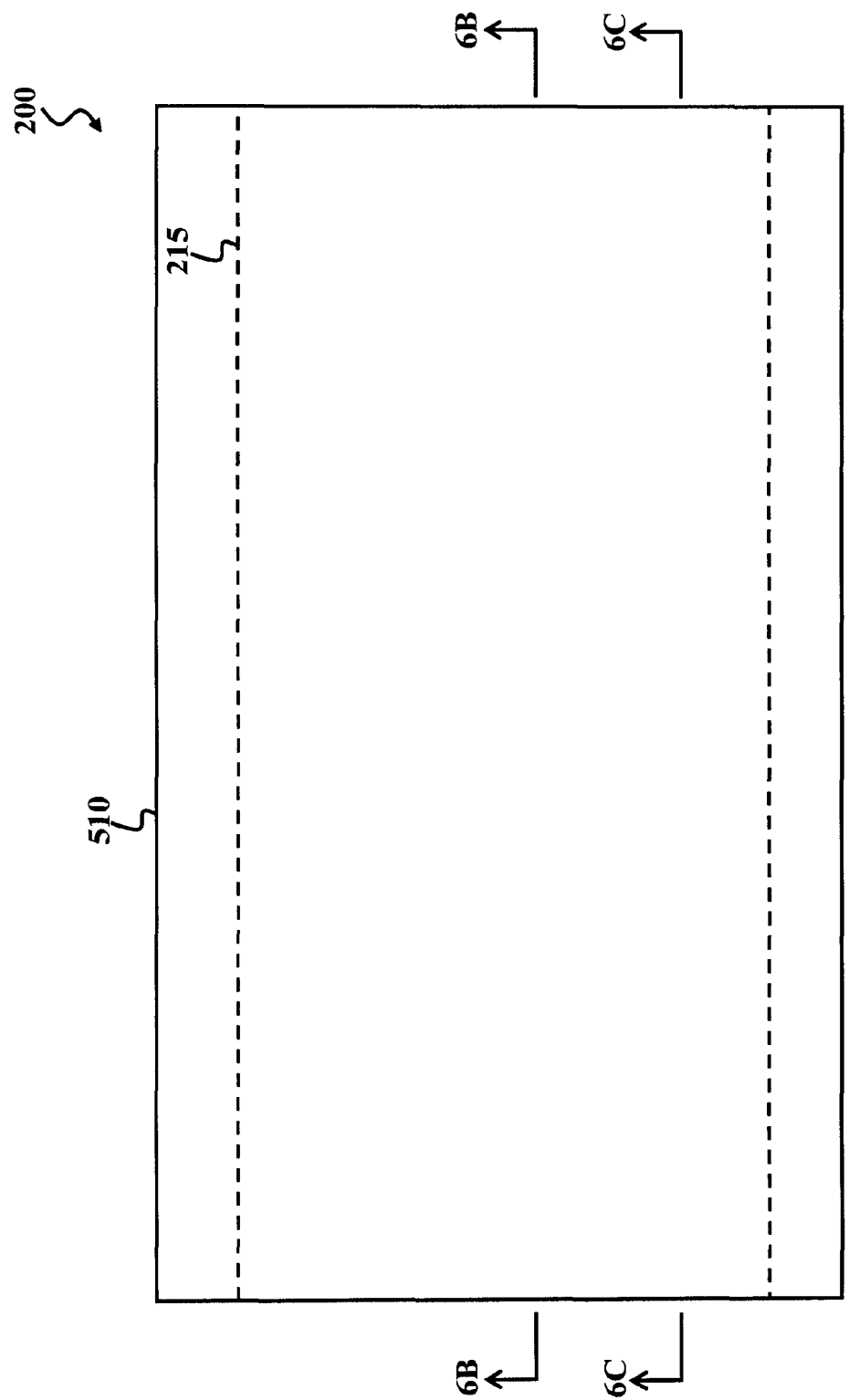
Figure 6B:
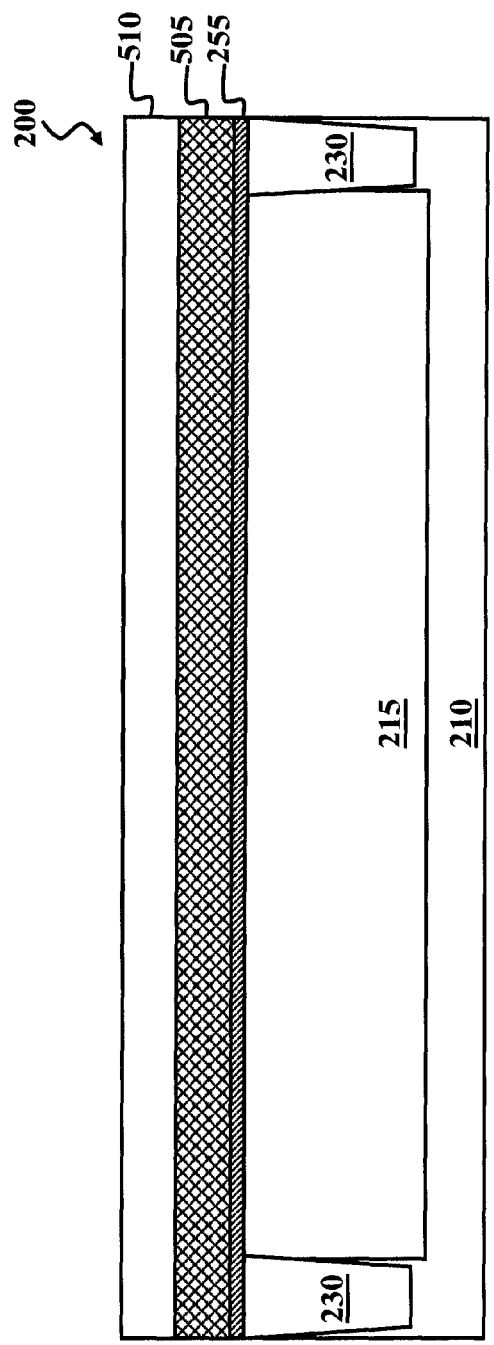
Figure 6C:
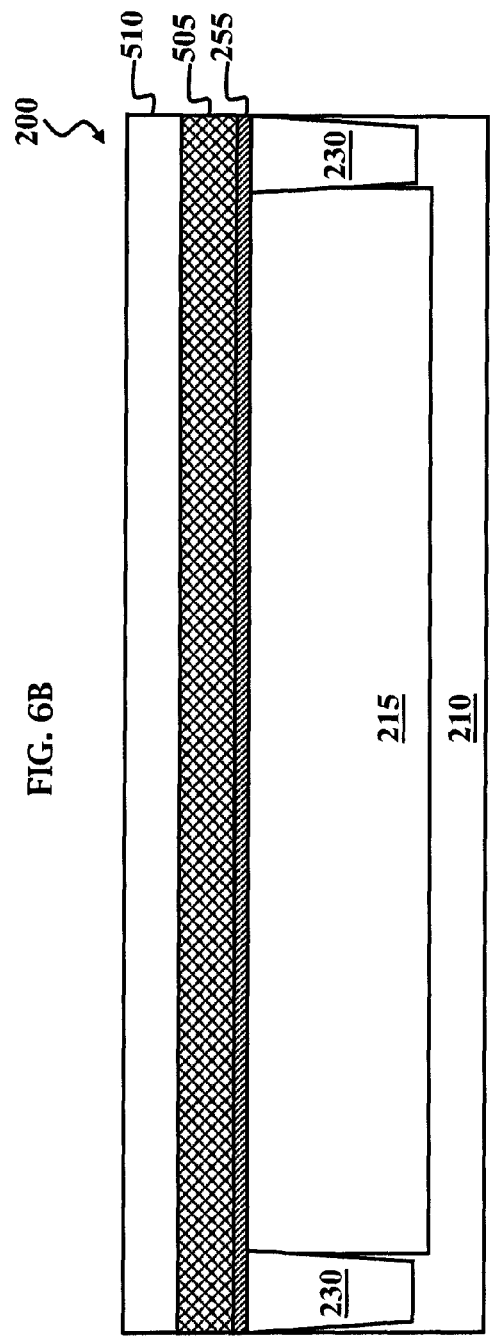

The post features described herein may also be introduced into other integrated circuit devices. For example, the post features may be introduced into a gate structure of a transistor. FIG. 5A is a top view of an embodiment of a transistor 400, in entirety or portion thereof, that can be included in the integrated circuit device of FIG. 1. FIG. 5B is a diagrammatic cross-sectional view, in entirety or portion thereof, taken along line 5B-5B of the transistor 400 in FIG. 5A; and FIG. 5C is a diagrammatic cross-sectional view, in entirety or portion thereof, taken along line 5C-5C of the transistor 400 in FIG. 5A. FIGS. 5A-5C will be discussed concurrently and have been simplified for the sake of clarity to better understand the inventive concepts of the present disclosure. The embodiment of FIGS. 5A-5C is similar in many respects to the embodiment of FIGS. 2A-2C. Accordingly, similar features in FIGS. 2A-2C and FIGS. 5A-5C are identified by the same reference numerals for clarity and simplicity. Additional features can be added in the transistor 400, and some of the features described below can be replaced or eliminated for other embodiments of the transistor 400.

As noted, in FIGS. 5A-5C, the device illustrated is a transistor 400, not a MOSCAP. In the transistor 400, the doped regions 220 are source and drain regions, and the material gate stack 250 is replaced by a gate stack 450 having a gate dielectric layer 455 and a gate electrode 460. The gate stack 450 is similar to the material layer stack 250, the gate dielectric layer 455 is similar to the dielectric layer 455, and the gate electrode 460 is similar to the electrode 260. In the depicted embodiment, the doped region 220 are not coupled together, and each of the doped regions forms a terminal 445 of the transistor 400. The transistor 400 thus includes a terminal formed by the doped region 220 (such as a source region), a terminal 445 formed by another doped region 220 (such as a drain region), and a terminal 475 formed by the gate stack 450. A voltage may be applied to the doped regions 220 and gate stack 450 via the respective terminals 445 and 475 during operation of the transistor 400.

The transistor 400 includes at least one post feature 480 disposed in the gate stack 450. In the depicted embodiment, the post features 480 extend through the gate stack 450, specifically through the gate electrode 460 and the gate dielectric layer 455. The post features 480 have a top surface that is substantially planar with a top surface of the gate stack 450, such as the gate electrode 460. In the depicted embodiment, the post features 480 include a dielectric material. The dielectric material can include silicon oxide, silicon nitride, silicon oxynitride, other suitable material, or combinations thereof. For example, in the depicted embodiment, the post features 480 include a portion of the dielectric layer 235 and spacers 265. The post features 480 can therefore be formed simultaneously with the dielectric layer 235 and the spacers 265.

Dimensions of the post features 480 are designed such that the post features 480 retard a polishing process, such as a chemical mechanical polishing process during fabrication of the transistor 400, without affecting overall device performance. By retarding a polishing process, the post feature 480 can also ensure that a height of the gate stack 450 is maintained during processing, thereby providing improved device performance, such as increased drive current, of the transistor 400. The post features 480 have the dimension $d_1$ and the dimension $d_2$. In the depicted embodiment, the dimension $d_1$ is greater than or equal to about 0.1 μm, and the dimension $d_2$ ranges from about 0.3 μm to about 1 μm. The dimension $d_1$ indicates a width of each post feature 480, and the dimension $d_2$ indicates a length of each post feature 480. In the depicted embodiment, in contrast to the MOSCAPS 200 and 300, the width ($d_1$) of the post features 480 extends in a direction that is substantially perpendicular to the width ($D_1$) of the gate stack 450, and the length ($d_2$) of the post features 280 extends in a direction that is substantially perpendicular to the length ($D_2$) of the gate stack 450. Put another way, the length of the post features 480 extends in a direction parallel to a channel direction of the transistor 400. Further, each post feature 480 is vertically spaced from a perimeter of the gate stack 450 by a value represented by a, vertically spaced from another post feature 480 by a value represented by b, and horizontally spaced from the perimeter of the gate stack 450 by a value represented by c. In the depicted embodiment, each of the values a, b, and c is greater than or equal to about 0.5 μm. More or less post features 480 may be included in the transistor 400 than those illustrated in FIGS. 5A-5C.

FIGS. 6A-11A are top views of the MOSCAP 200, in entirety or portion thereof, during various stages of fabrication. FIGS. 6B-11B and 6C-11C are diagrammatic cross-sectional views, in entirety or portion thereof, of the MOSCAP 200 in FIGS. 6A-11A, respectively. FIGS. 6A-11A, 6B-11B, and 6C-11C will be discussed concurrently and have been simplified for the sake of clarity to better understand the inventive concepts of the present disclosure. As noted above, additional features can be added in the MOSCAP 200, and some of the features described below can be replaced or eliminated for other embodiments of the MOSCAP 200. Further, additional steps can be provided before, during, and after the steps illustrated in FIGS. 6A-11A, 6B-11B, and 6C-11C, and some of the steps described can be replaced or eliminated for other embodiments of fabricating the MOSCAP 200.

In FIGS. 6A-6C, 7A-7C, 8A-8C, and 9A-9C, a material layer stack is formed over a doped region of a substrate. For example, in FIGS. 6A-6C, as described above with reference to FIGS. 2A-2C, doped region 215 and isolation features 230 are formed in the semiconductor substrate 210. The isolation features 230 may be formed before the doped region 215, such that the isolation features 230 define where the doped region 215 is formed in the semiconductor substrate 210. Thereafter, a dielectric layer 255 is formed over the semiconductor substrate 210, a dummy layer 505 is formed over the dielectric layer 255, and a hard mask layer 510 is formed over the dummy layer 505. In the depicted embodiment, the dummy layer 505 is a polysilicon layer. The hard mask layer 510 includes a suitable material, such as silicon nitride, silicon oxynitride, other suitable material or combinations thereof. The dummy layer 505 and hard mask layer 510 are formed by a suitable process, such as those described herein.

Figure 7A:
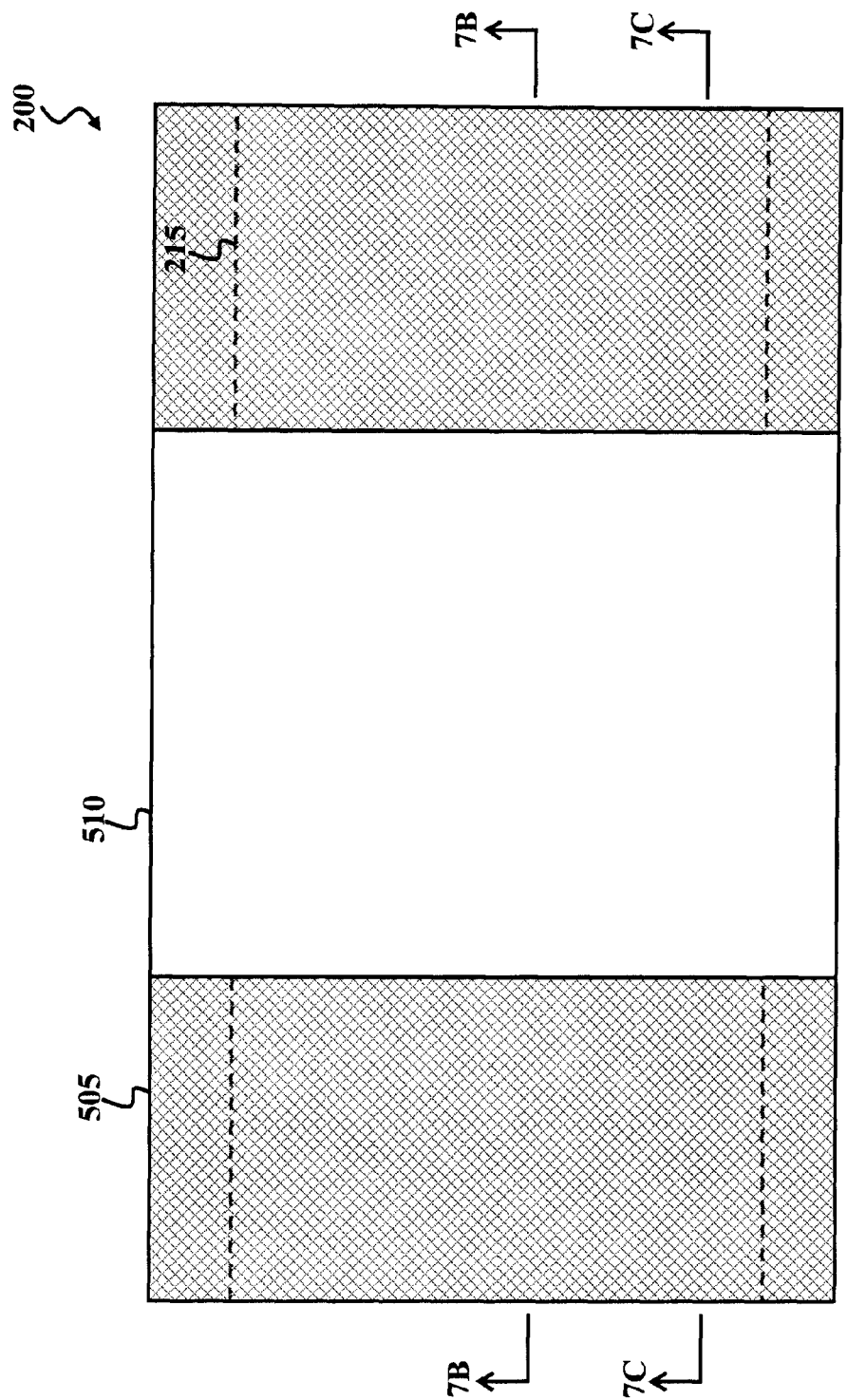
Figure 7B:
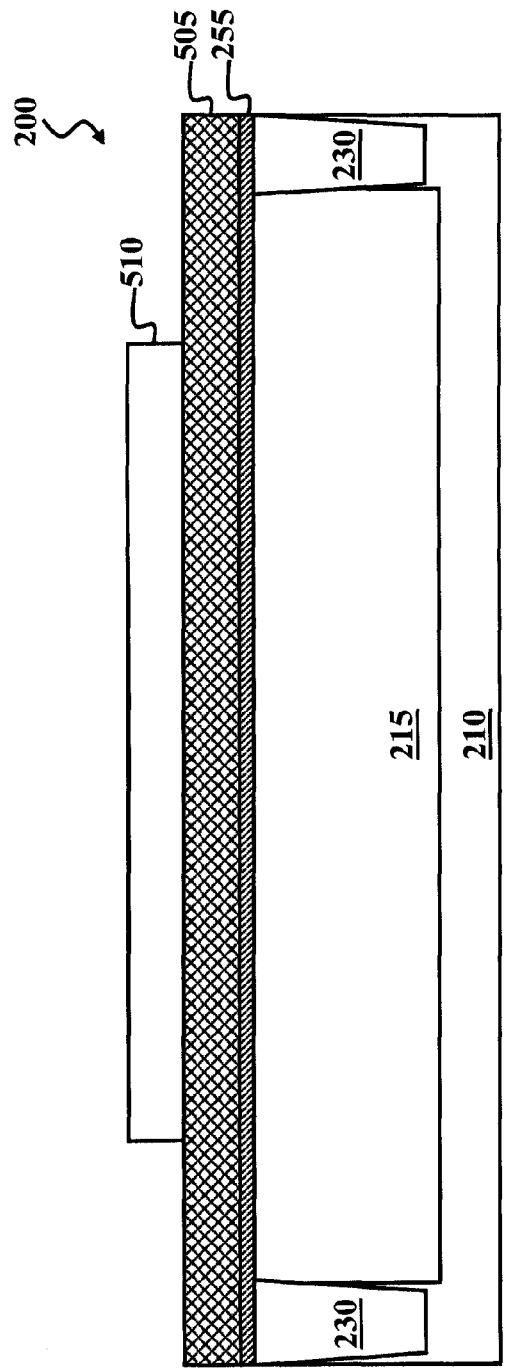
Figure 7C:
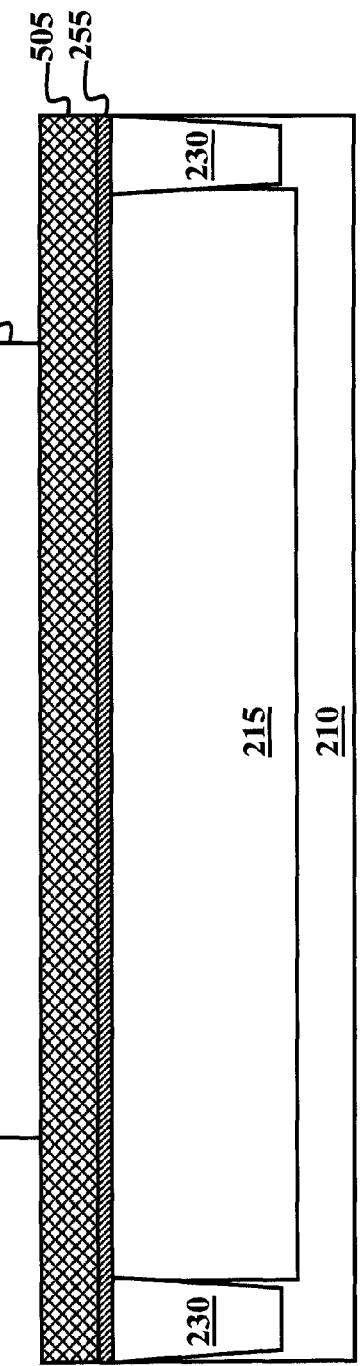
Figure 8B:
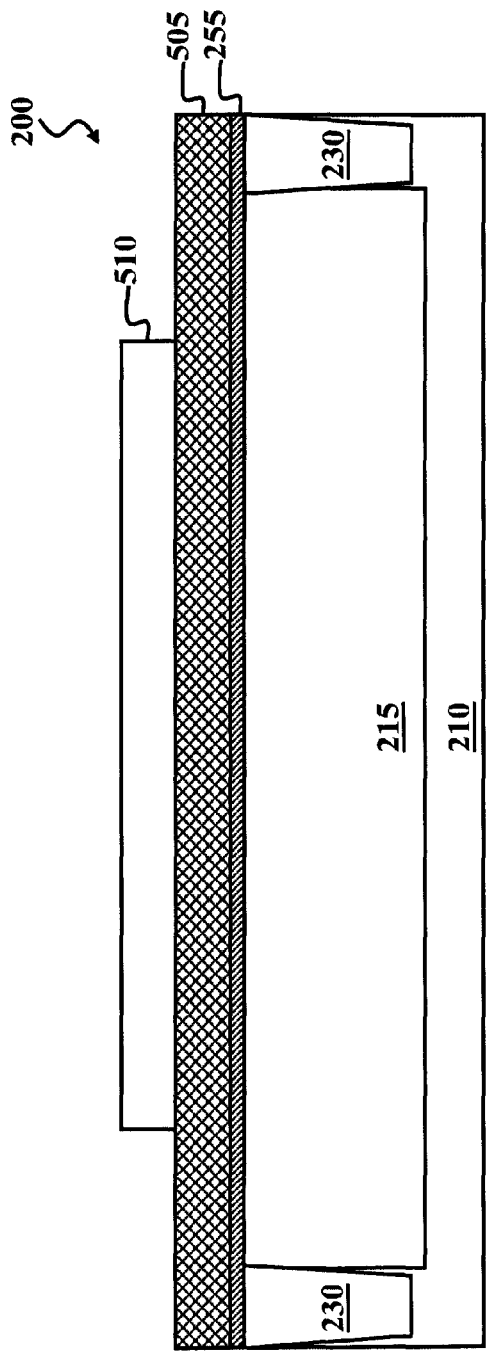
Figure 8C:
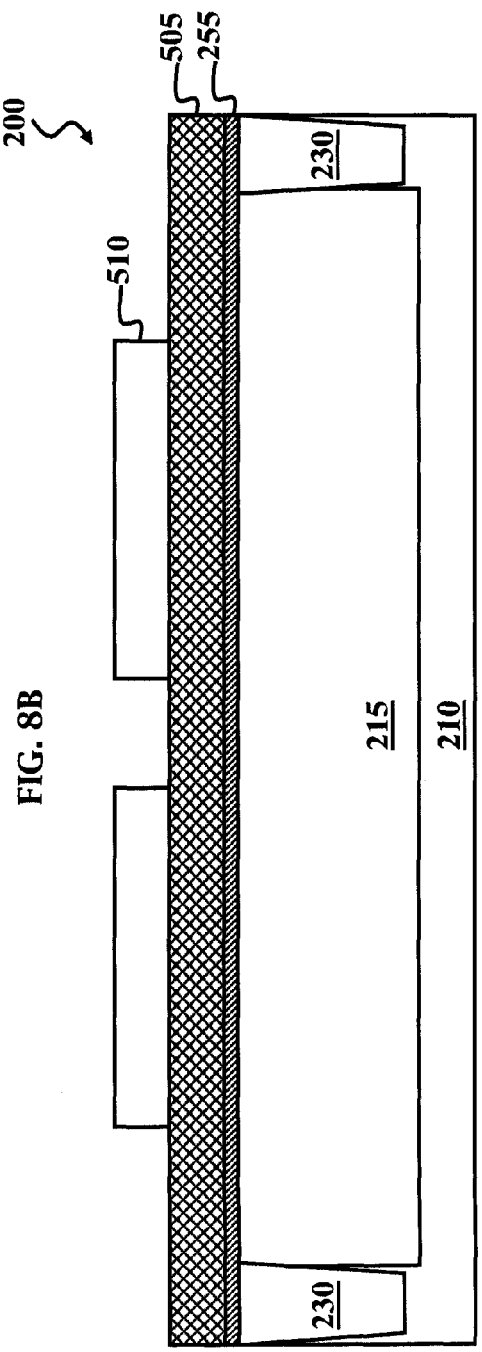

In FIGS. 7A-7C, the hard mask layer 510 is subjected to a patterning process, thereby exposing portions of the dummy layer 505, and in FIGS. 8A-8C, the hard mask layer 510 is subjected to another patterning process, thereby exposing additional portions of the dummy layer 505. In an example, the patterning process used to achieve the patterned hard mask layer 510 in FIGS. 7A-7C is a first cut process (such as a first polysilicon cut) used to pattern gate stacks for other devices of an integrated circuit device (such as a transistor), and the patterning process used to achieve the patterned hard mask layer 510 in FIGS. 8A-8C is a second cut process (such as a second polysilicon cut) used to pattern the gate stacks. The patterning processes include lithography patterning and etching processes. The lithography patterning processes include photoresist coating (e.g., spin-on coating), soft baking, mask aligning, exposure, post-exposure baking, developing the photoresist, rinsing, drying (e.g., hard baking), other suitable lithography patterning processes, or combinations thereof. Alternatively, the lithography exposing process is implemented or replaced by other methods, such as maskless photolithography, electron-beam writing, and/or ion-beam writing. In yet another alternative, the lithography patterning process could implement nanoimprint technology. The etching processes include dry etching, wet etching, and/or other etching methods.

Figure 9A:
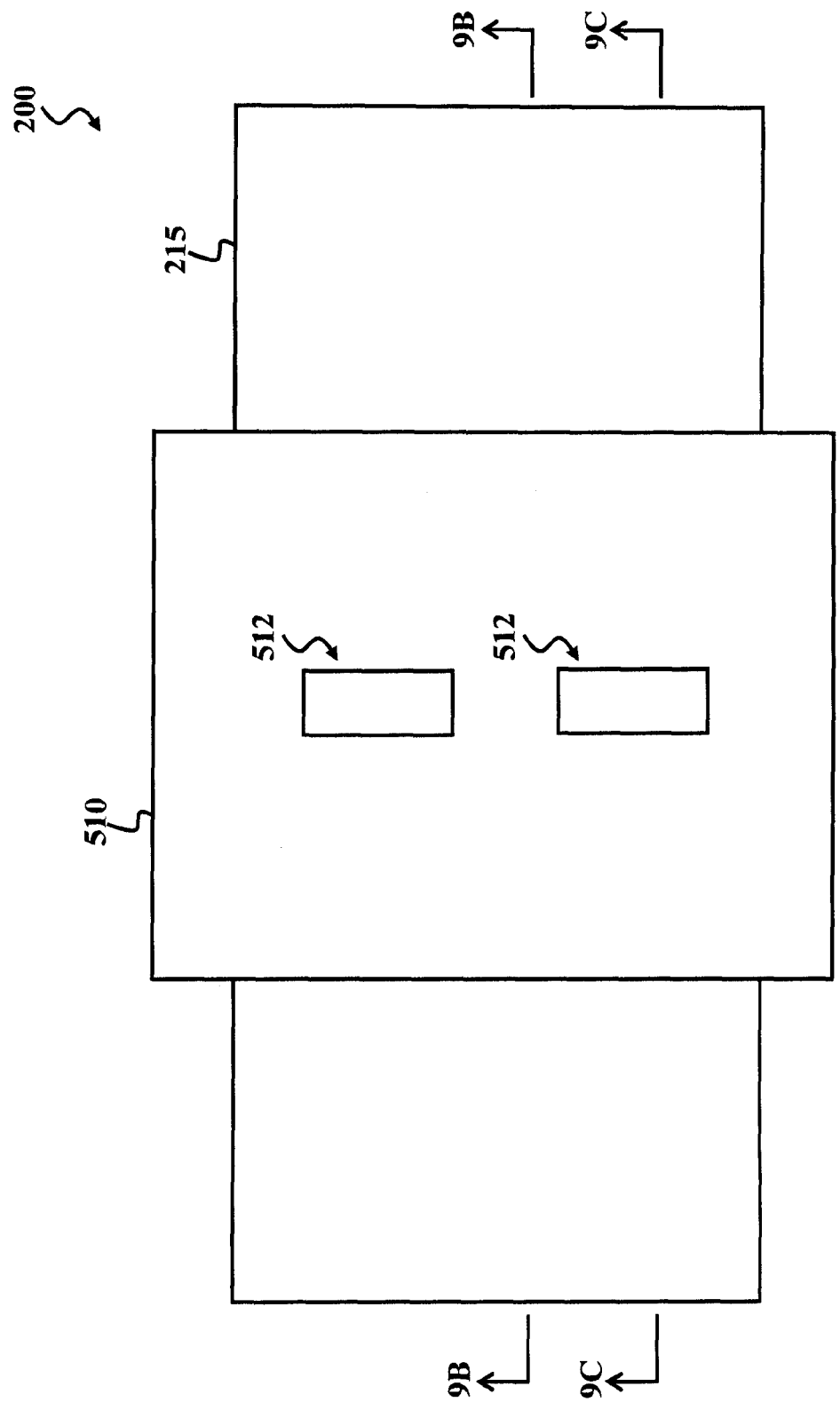

In FIGS. 9A-9C, the dummy layer 505 exposed by the patterned hard mask layer 510, and underlying dielectric layer 255, is removed by a suitable process, such as an etching process. The etching process may be a dry etching, wet etching, other etching method, or combination thereof. Removing the exposed dummy layer 505 leaves the material layer stack 250 (including the hard mask layer 510, dummy layer 505, and dielectric layer 255) having openings 512 therein. In the depicted embodiment, the openings 512 exposes the semiconductor substrate 210. The openings 512 have a length that extends in a direction parallel with a length of the material layer stack 250, and a width that extends in a direction parallel with a width of the material layer stack 250.

Figure 10A:
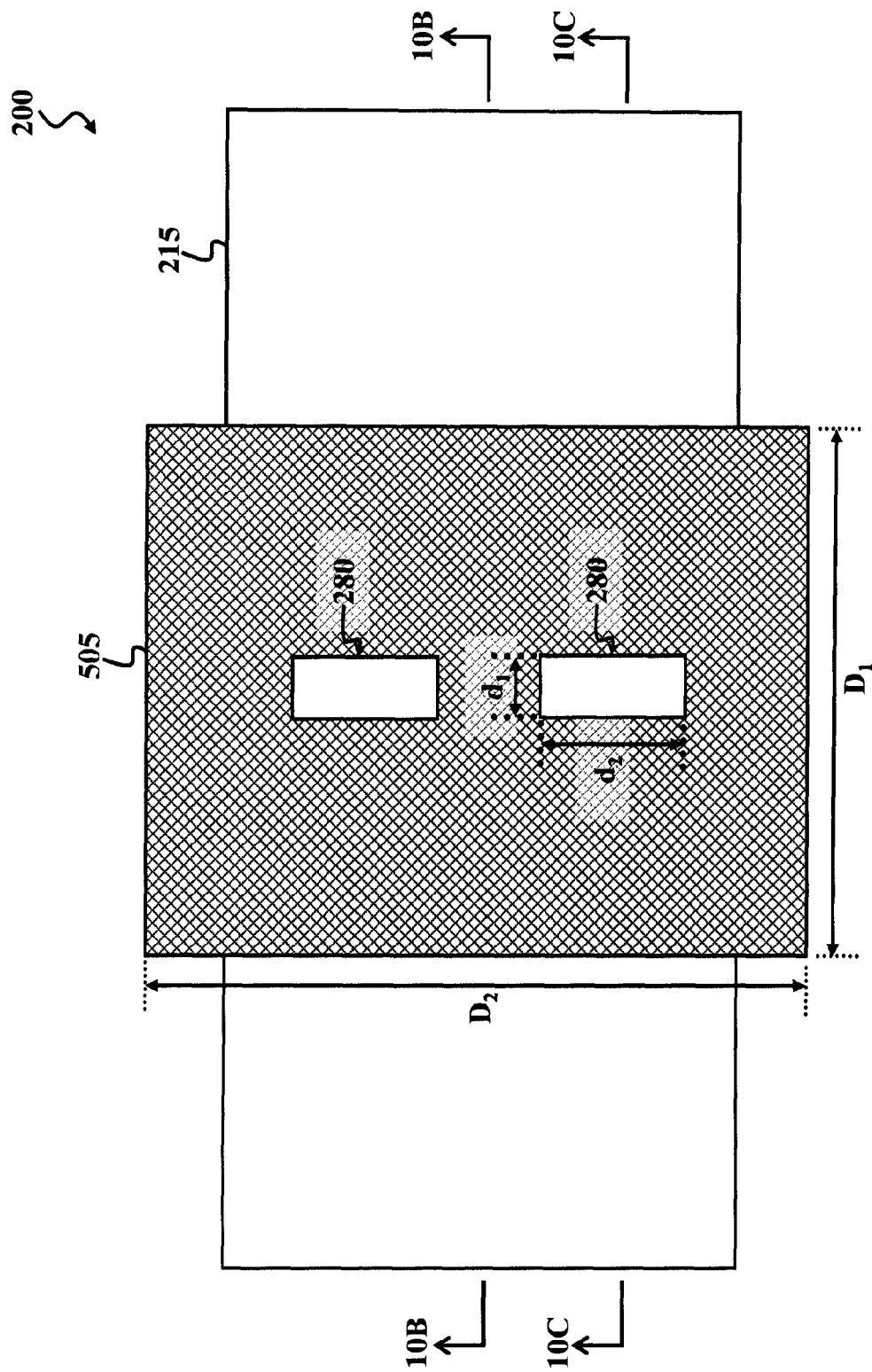

In FIGS. 10A-10C, various features of the MOSCAP 200 are formed by suitable processes. For example, with the hard mask layer 510 remaining over the dummy layer 505 and dielectric layer 255, the dielectric features 265 are formed as described above. The dielectric features 265 partially fill the opening 512 within the material layer stack 250. The doped regions 220 are formed in the substrate 210. The material layer stack 250 (including the hard mask layer 510) can be used as a mask for defining areas of the substrate 210 where the doped regions 220 are formed. The silicide features 225 can be formed by a self-aligned salicide process. Thereafter, the hard mask layer 510 is removed, and the dielectric layer 235 is formed over the substrate 210. The dielectric layer 235 fills the remaining opening 512, such that the post features 280 (including the dielectric features 265 and dielectric layer 235) are formed in the opening 512 of the material layer stack 250. A chemical mechanical polishing process may be implemented to planarize the dielectric layer 235.

Figure 11A:
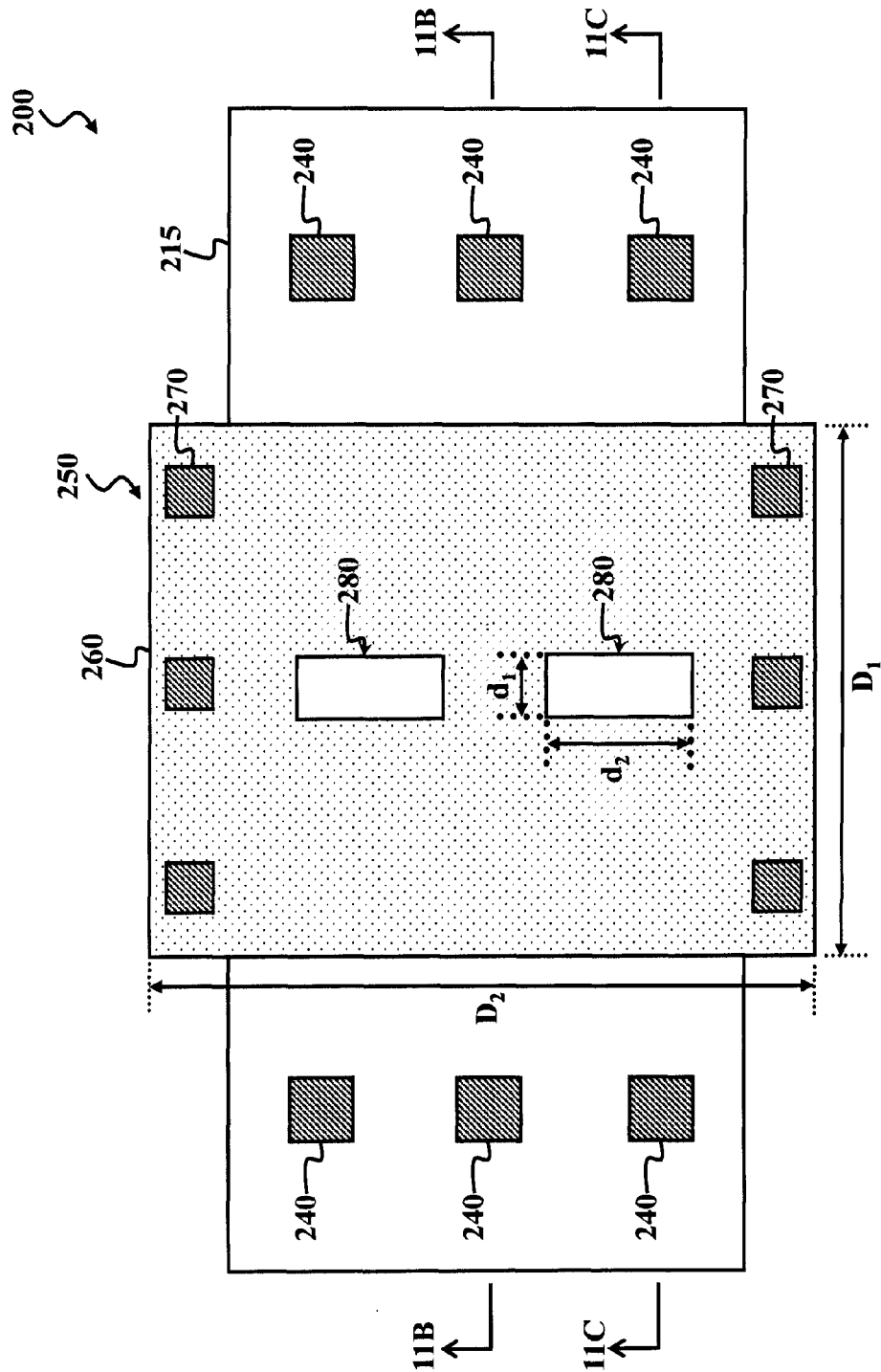
Figures 11B, 11C:
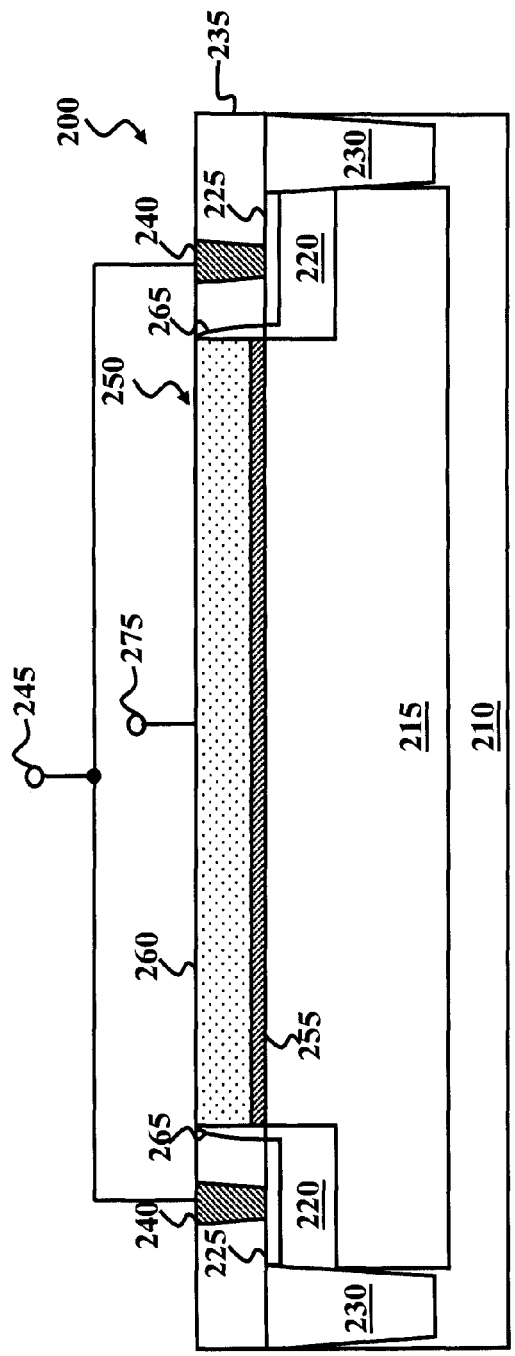

In FIGS. 11A-11C, the dummy layer 505 of is replaced with the electrode 260, such that the material layer stack 250 includes the dielectric layer 255 and the electrode 260. For example, the dummy layer 505 is removed, by an etching process for example, from the material layer stack 250, leaving an opening therein, which is filled with a metal layer. In an example, the metal layer includes a material having a p-type work function (in other words, a p-metal). Accordingly, the electrode 260 can be simultaneously formed with a metal gate of a p-type transistor, such as a p-type MOS transistor. Alternatively, the metal layer includes a material having an n-type work function. A chemical mechanical polishing process is used to planarize the metal layer, thereby forming the electrode 260. During the chemical mechanical polishing process, the post features 280 can retard the polishing process to prevent dishing in the electrode 260. Thereafter, the contacts 240 and 275 are formed by a suitable process, such as those described herein. It is noted that the electrode 260 may be subjected to another polishing process, such as a chemical mechanical polishing process used to planarize a metal layer of an n-type MOS transistor. The post features 280 again act to retard the polishing process to prevent dishing in the electrode 260.

FIGS. 12A-15A are top views of the MOSCAP 300, in entirety or portion thereof, during various stages of fabrication. FIGS. 12B-15B are diagrammatic cross-sectional views, in entirety or portion thereof, of the MOSCAP 300 in FIGS. 12A-15A, respectively; and FIG. 15C is a diagrammatic cross-sectional view, in entirety or portion thereof, of the MOSCAP 300 in FIG. 15A. FIGS. 12A-15A, 12B-15B, and 15C will be discussed concurrently and have been simplified for the sake of clarity to better understand the inventive concepts of the present disclosure. As noted above, additional features can be added in the MOSCAP 300, and some of the features described below can be replaced or eliminated for other embodiments of the MOSCAP 300. Further, additional steps can be provided before, during, and after the steps illustrated in FIGS. 12A-15A, 12B-15B, and 15C, and some of the steps described can be replaced or eliminated for other embodiments of fabricating the MOSCAP 300.

Figure 12A:
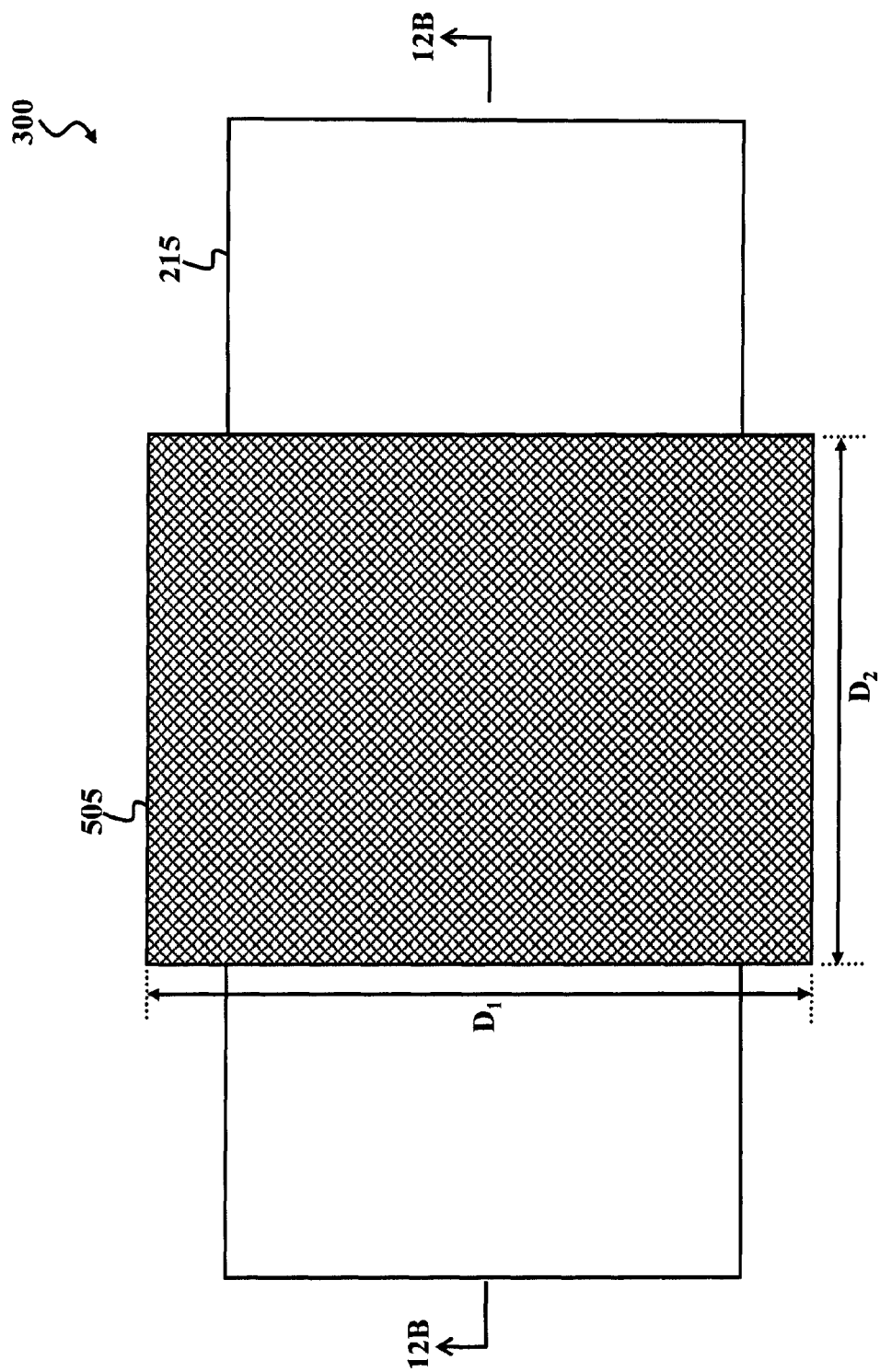
Figure 12B:
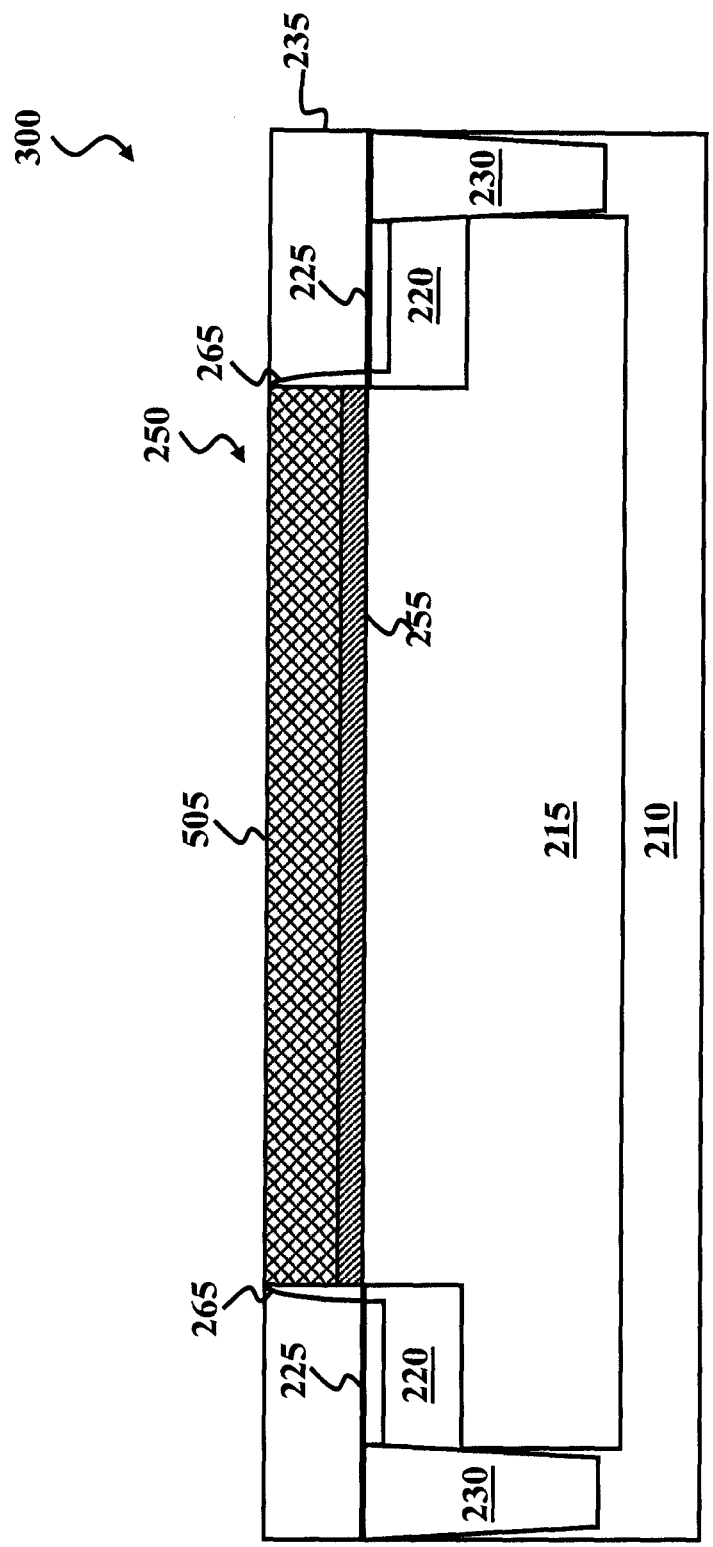
Figure 13A:
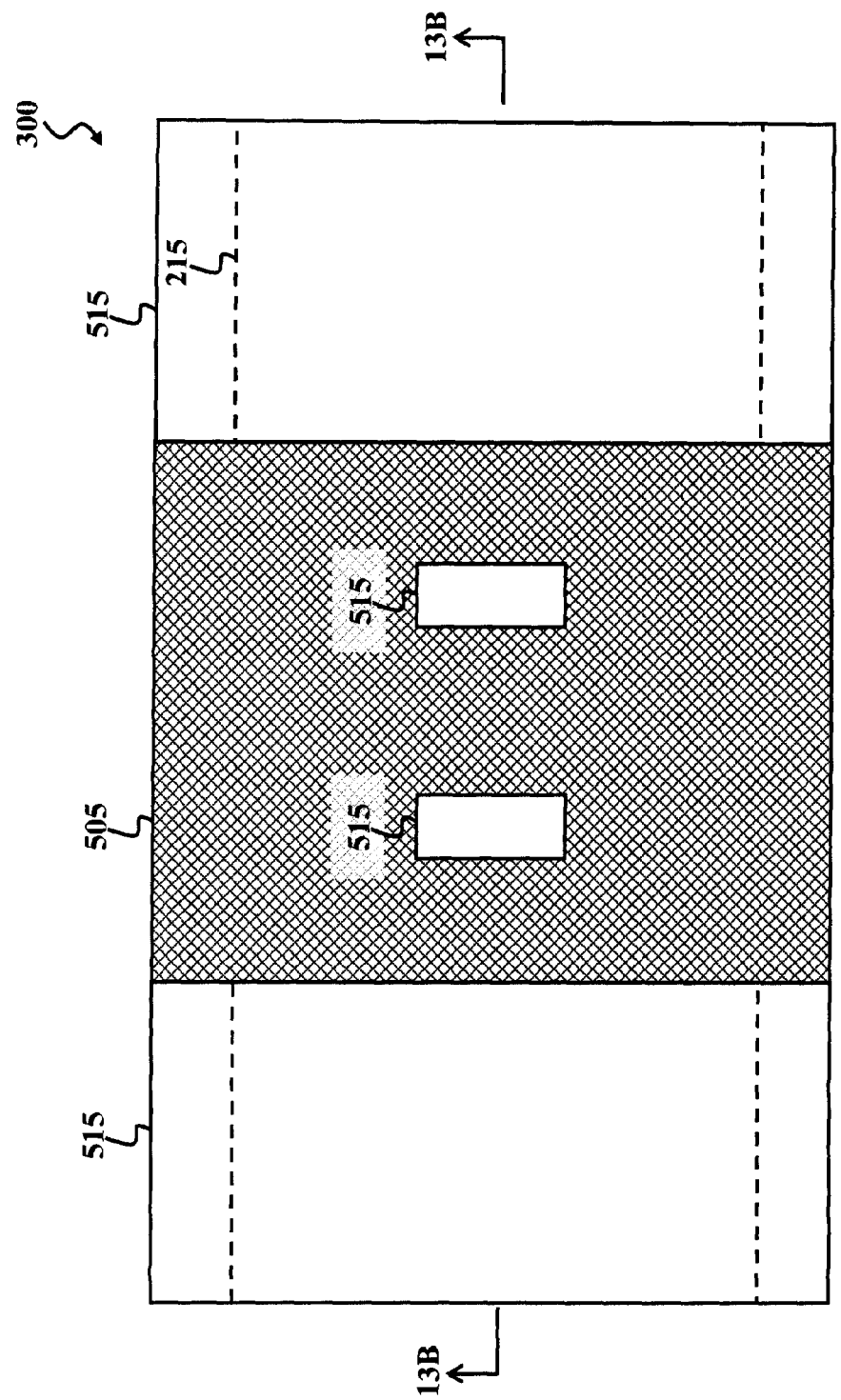
Figure 13B:
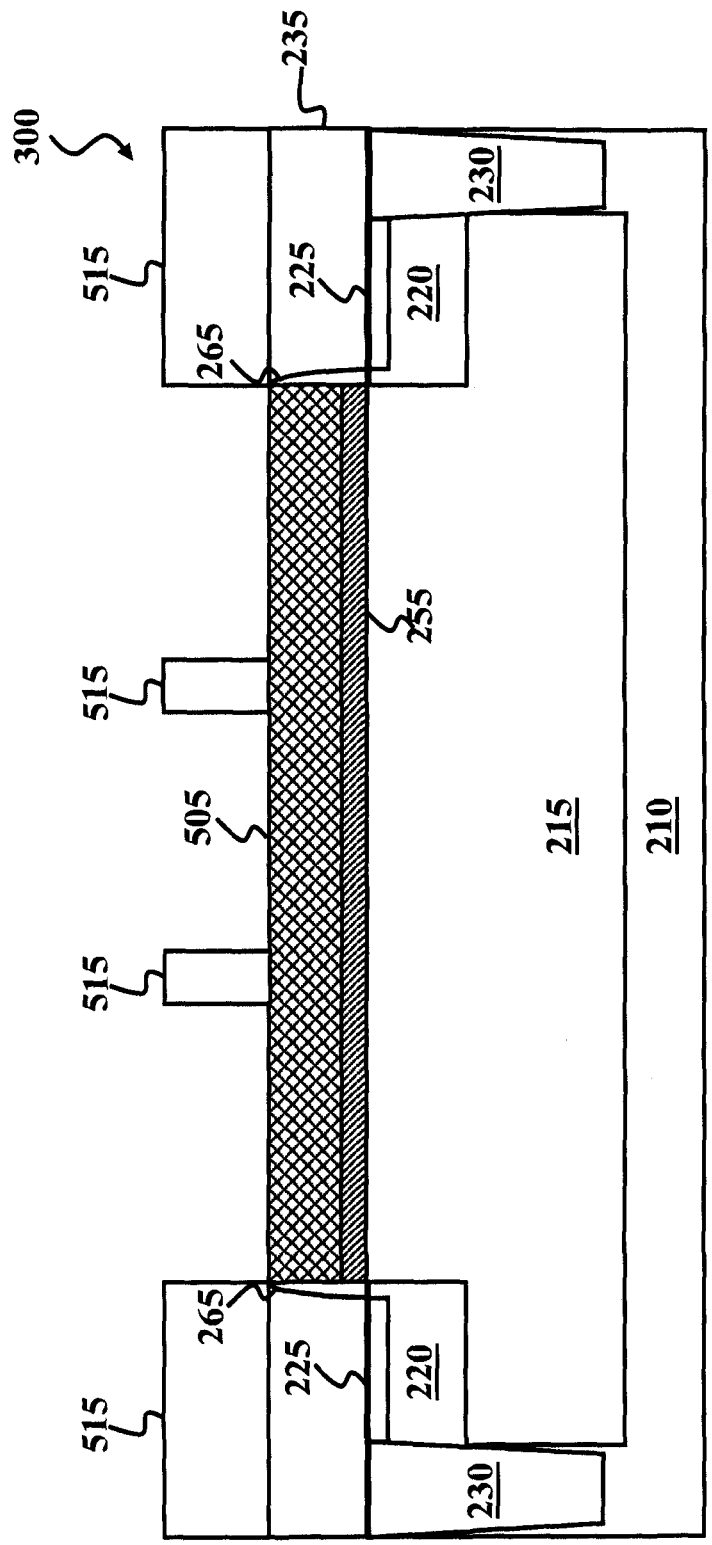

In FIGS. 12A and 12B, the substrate 210 is provided, and any suitable processing, such as that described herein, forms the doped region 215, doped regions 220, silicide features 225, isolation features 230, dielectric layer 235, dielectric layer 255, dielectric features 265, and the dummy layer 505. In the depicted embodiment, the dummy layer 505 includes polysilicon. The material layer stack 250 includes the dummy layer 505 and the dielectric layer 255.

Figure 14B:
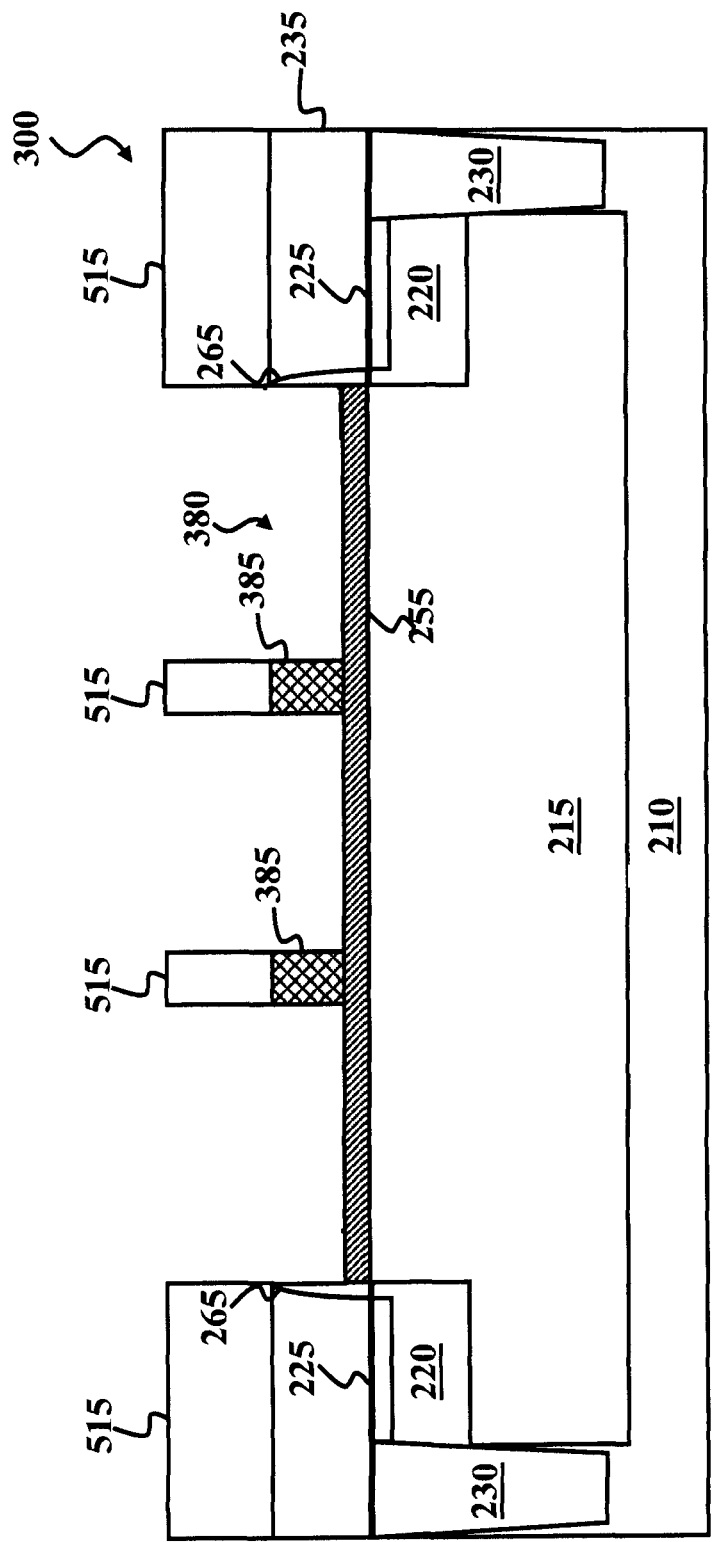

In FIGS. 13A-13B and 14A-14B, portions of the dummy layer 505 are removed from the material layer stack 250 to form the post features 380. For example, in FIGS. 13A-13B, a patterned photoresist layer 515 is formed over the substrate 210 that exposes portions of the dummy layer 505. The patterned photoresist layer 505 is formed by a lithography patterning processes, which can include photoresist coating (e.g., spin-on coating), soft baking, mask aligning, exposure, post-exposure baking, developing the photoresist, rinsing, drying (e.g., hard baking), other suitable lithography patterning processes, or combinations thereof. Alternatively, the lithography exposing process is implemented or replaced by other methods, such as maskless photolithography, electron-beam writing, and/or ion-beam writing. In yet another alternative, the lithography patterning process could implement nanoimprint technology. In FIGS. 14A-14B, the exposed portions of the dummy layer 505 are then removed by a suitable process, such as an etching process. The etching processes include dry etching, wet etching, and/or other etching methods. Where the dummy layer 505 is removed, the dielectric layer 255 is exposed by the patterned photoresist layer 212. The remaining portions of the dummy layer 505 (disposed under the patterned photoresist layer 515) form the post features 380 that include polysilicon features 385. The post features 380 have a length that extends in a direction parallel with a length of the material layer stack 250, and a width that extends in a direction parallel with a width of the material layer stack 250.

Figure 15A:
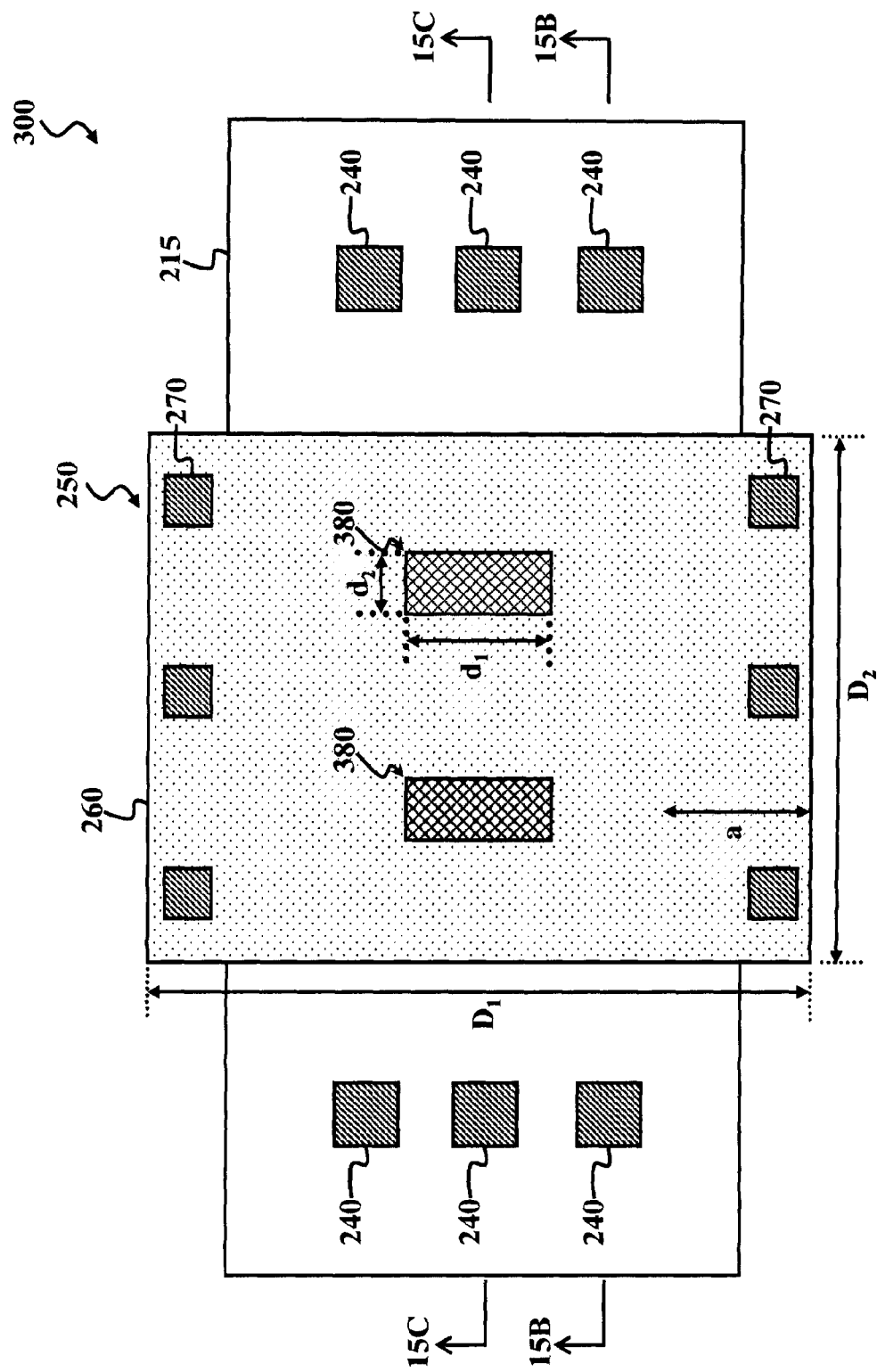
Figure 15B:
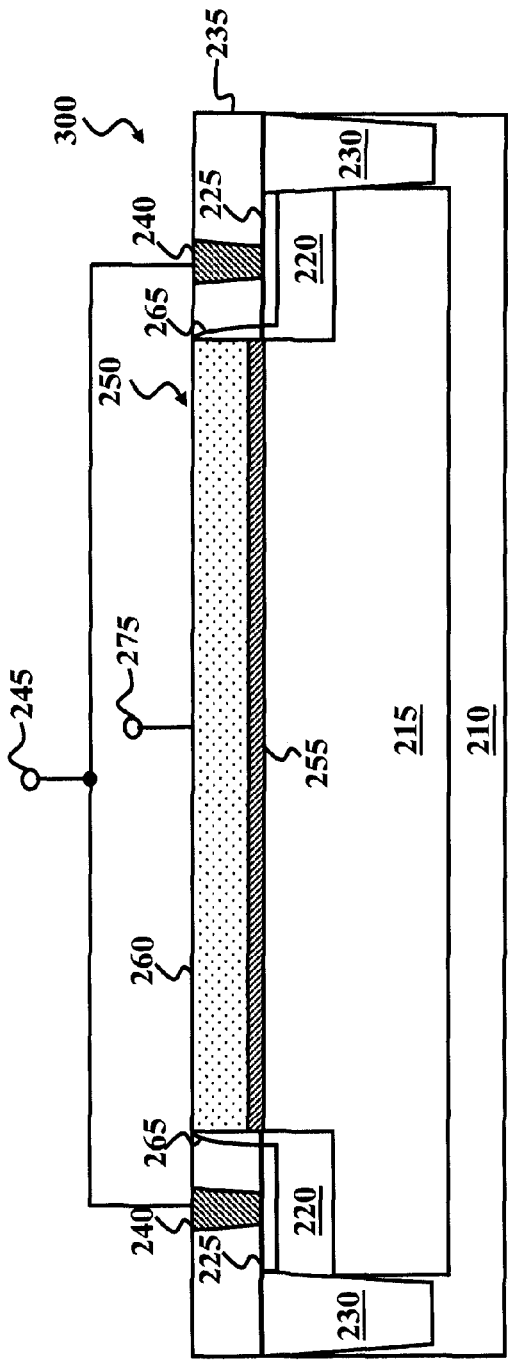
Figure 15C:
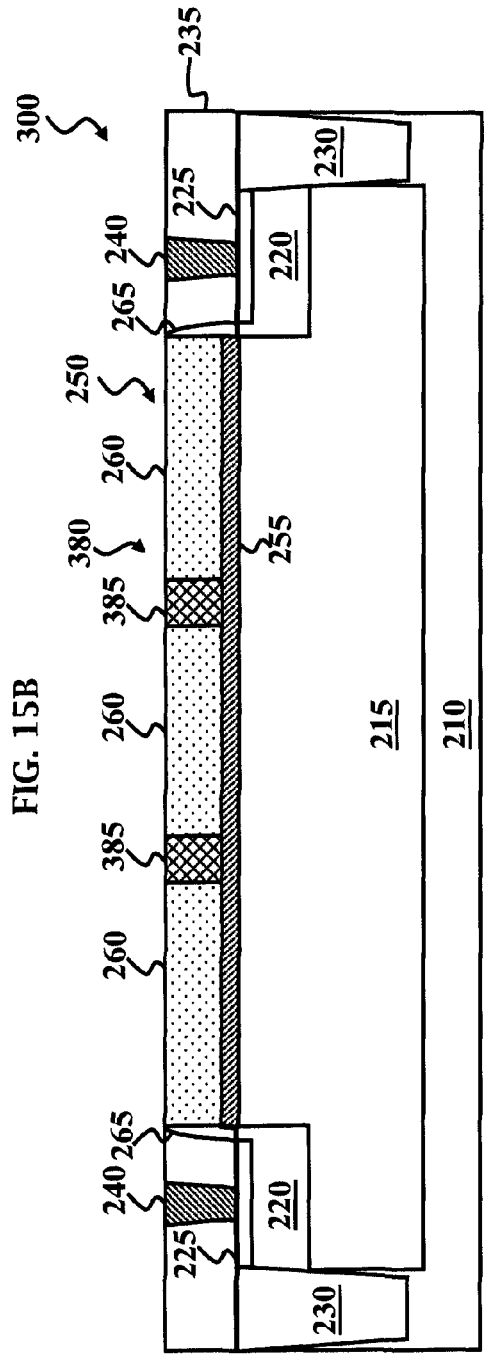
FIG. 15C is a diagrammatic cross-sectional view, in entirety or portion thereof, of the MOSCAP in FIGS. 15A-15B.

Thereafter, in FIGS. 15A-15C, a metal layer is formed over the exposed dielectric layer 255. A chemical mechanical polishing process is used to planarize the metal layer, thereby forming the electrode 260, such that the material layer stack 250 includes the dielectric layer 255 and the electrode 260. In an example, the metal layer includes a material having a p-type work function (in other words, a p-metal). Accordingly, the electrode 260 can be simultaneously formed with a metal gate of a p-type transistor, such as a p-type MOS transistor. Alternatively, the metal layer includes a material having an n-type work function. During the chemical mechanical polishing process, the post features 380, particularly the polysilicon features 385, can retard the polishing process to prevent dishing in the electrode 260. Thereafter, the contacts 240 and 275 are formed by a suitable process, such as those described herein. It is noted that the electrode 260 may be subjected to another polishing process, such as a chemical mechanical polishing process used to planarize a metal layer of an n-type MOS transistor. The post features 380 again act to retard the polishing process to prevent dishing in the electrode 260.

FIGS. 16A-21A are top views of the transistor 400, in entirety or portion thereof, during various stages of fabrication. FIGS. 16B-21B and 16C-21C are diagrammatic cross-sectional views, in entirety or portion thereof, of the transistor 400 in FIGS. 16A-21A, respectively. FIGS. 16A-21A, 16B-21B, and 16C-21C will be discussed concurrently and have been simplified for the sake of clarity to better understand the inventive concepts of the present disclosure. As noted above, additional features can be added in the transistor 400, and some of the features described below can be replaced or eliminated for other embodiments of the transistor 400. Further, additional steps can be provided before, during, and after the steps illustrated in FIGS. 16A-21A, 16B-21B, and 16C-21C, and some of the steps described can be replaced or eliminated for other embodiments of fabricating the transistor 400.

In FIGS. 16A-16C, 17A-17C, 18A-18C, and 19A-19C, a gate stack is formed over a substrate. For example, in FIGS. 16A-16C, doped region 215 and isolation features 230 are formed in the semiconductor substrate 210. The isolation features 230 may be formed before the doped region 215, such that the isolation features 230 define where the doped region 215 is formed in the semiconductor substrate 210. Thereafter, a gate dielectric layer 455 is formed over the semiconductor substrate 210, a dummy layer 505 is formed over the gate dielectric layer 455, and a hard mask layer 510 is formed over the dummy layer 505. In the depicted embodiment, the dummy layer 505 is a polysilicon layer.

Figure 17A:
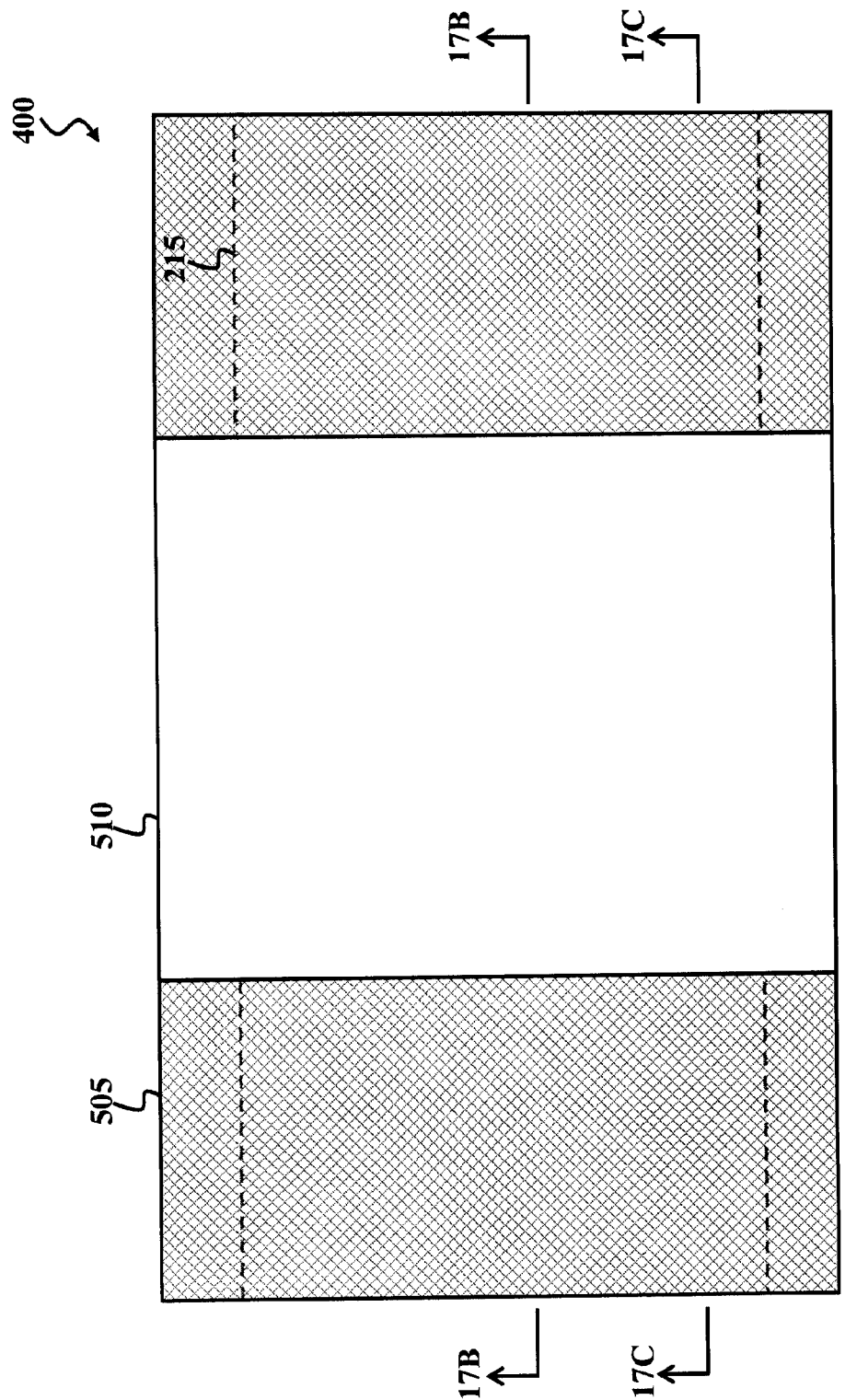
Figure 17B:
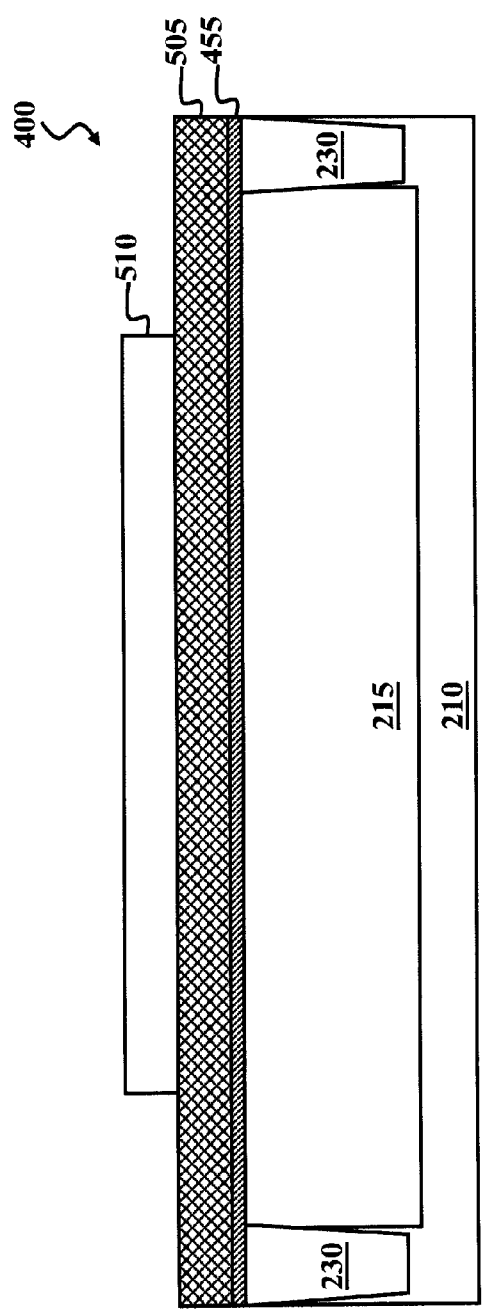
Figure 17C:
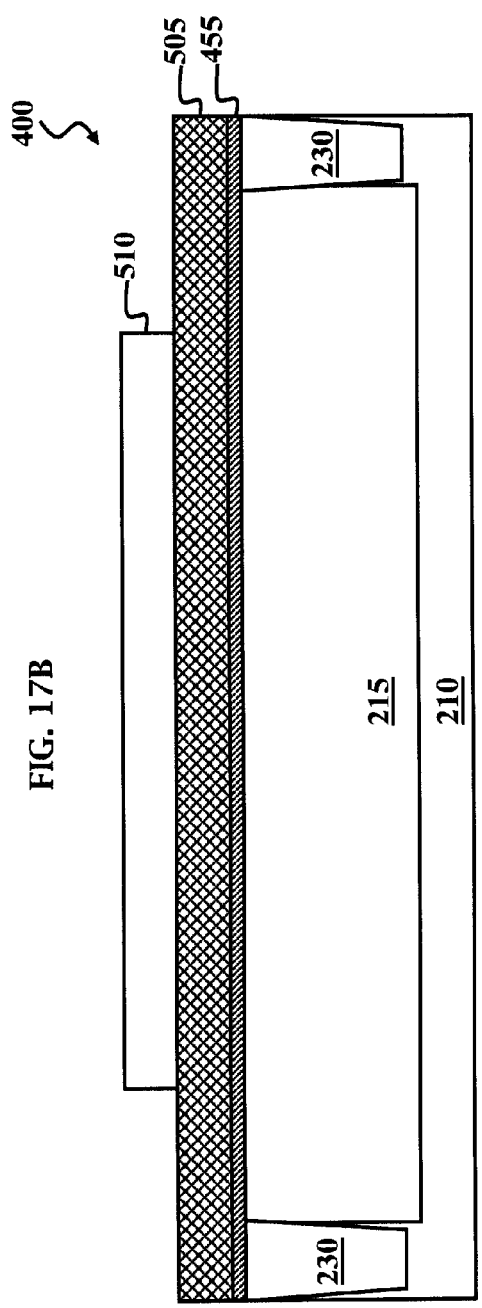
Figure 18A:
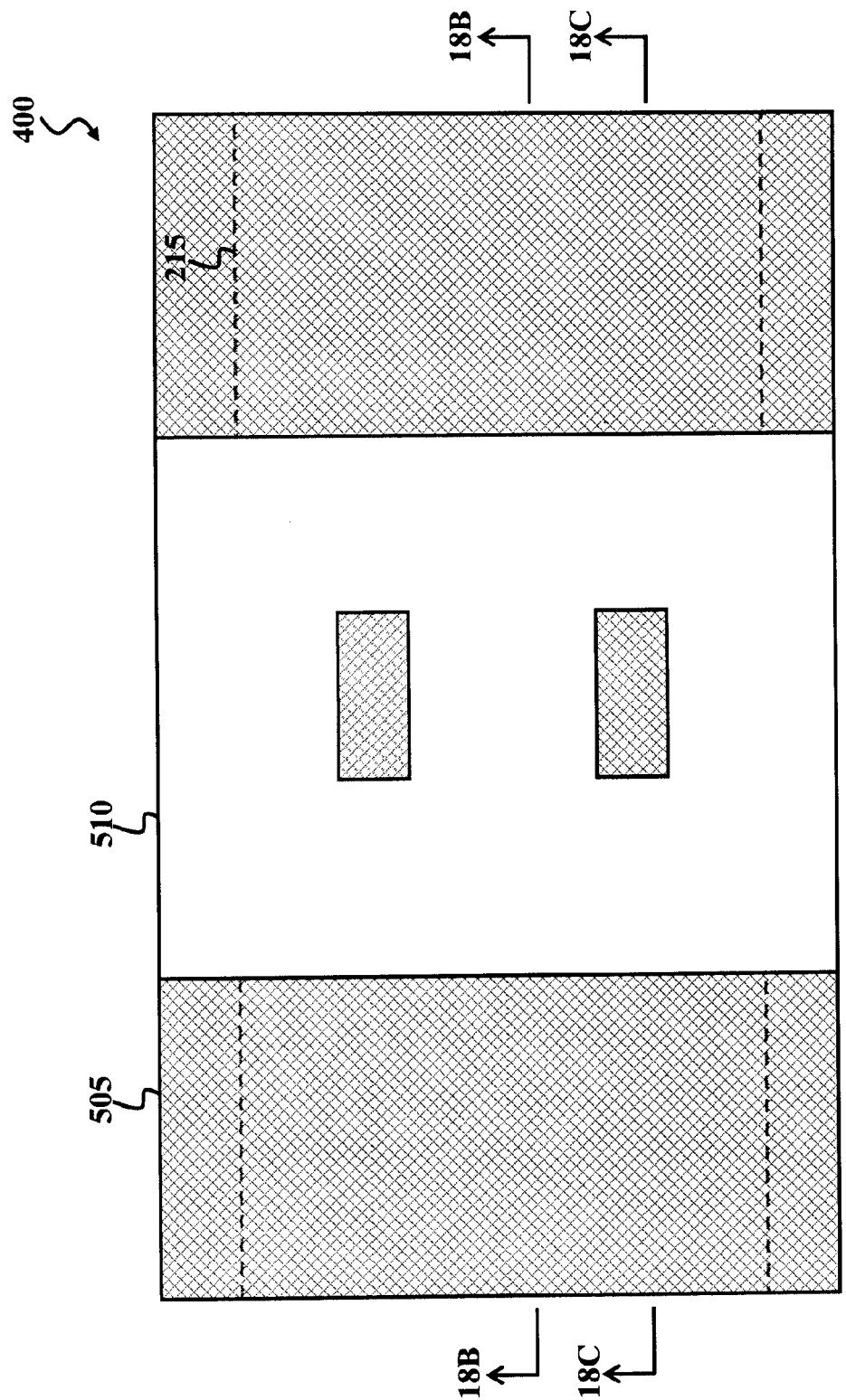
Figure 19A:
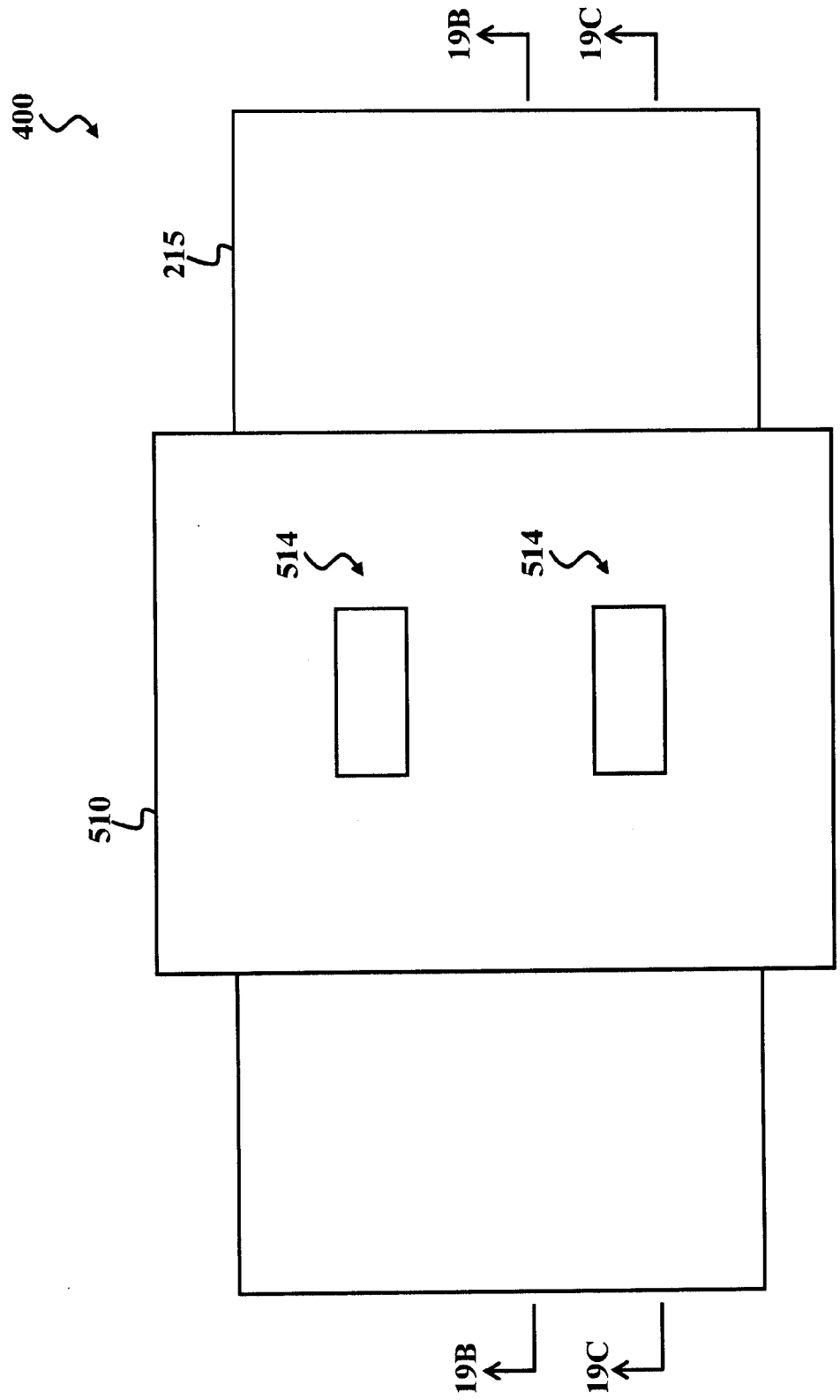
Figure 19B:
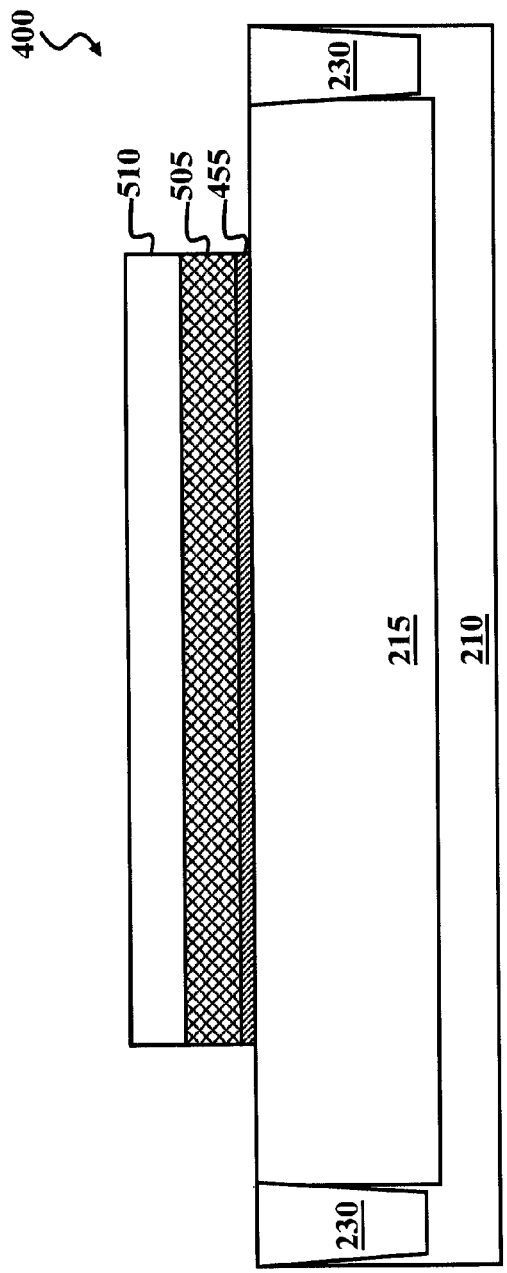
Figure 19C:
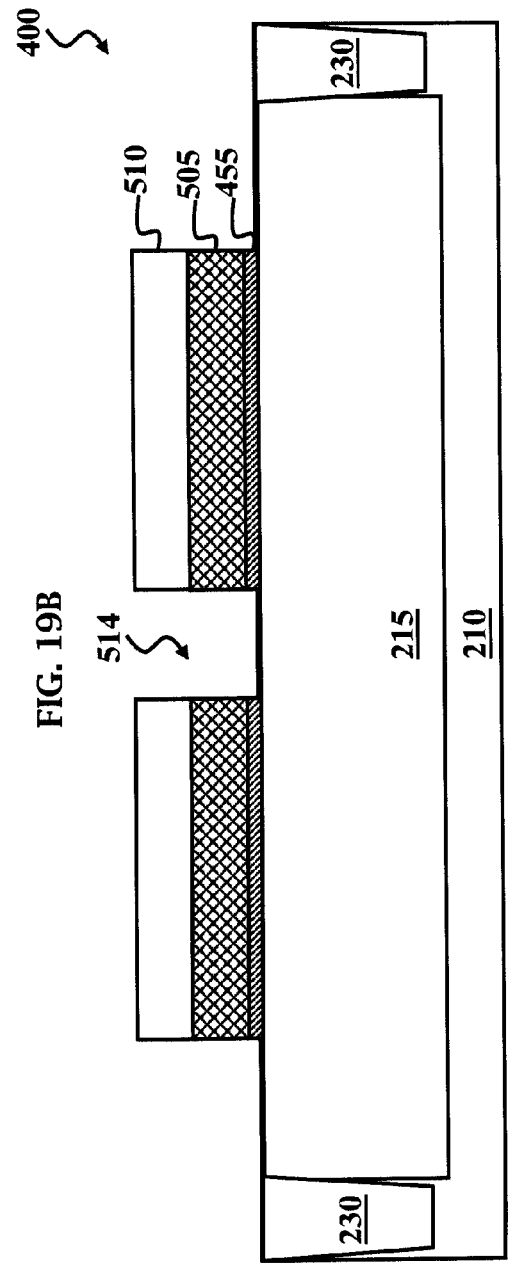

In FIGS. 17A-17C, the hard mask layer 510 is subjected to a patterning process, thereby exposing portions of the dummy layer 505, and in FIGS. 18A-18C, the hard mask layer 510 is subjected to another patterning process, thereby exposing additional portions of the dummy layer 505. In an example, the patterning process used to achieve the patterned hard mask layer 510 in FIGS. 17A-17C is a first cut process (such as a first polysilicon cut) used to pattern the gate stack, and the patterning process used to achieve the patterned hard mask layer 510 in FIGS. 18A-18C is a second cut process (such as a second polysilicon cut) used to pattern the gate stack. The patterning processes include lithography patterning and etching processes. The lithography patterning processes include photoresist coating (e.g., spin-on coating), soft baking, mask aligning, exposure, post-exposure baking, developing the photoresist, rinsing, drying (e.g., hard baking), other suitable lithography patterning processes, or combinations thereof. Alternatively, the lithography exposing process is implemented or replaced by other methods, such as maskless photolithography, electron-beam writing, and/or ion-beam writing. In yet another alternative, the lithography patterning process could implement nanoimprint technology. The etching processes include dry etching, wet etching, and/or other etching methods.

In FIGS. 9A-9C, the dummy layer 505 exposed by the patterned hard mask layer 510, and underlying gate dielectric layer 455, is removed by a suitable process, such as an etching process. The etching process may be a dry etching, wet etching, other etching method, or combination thereof. Removing the exposed dummy layer 505 leaves the gate stack 450 (including the hard mask layer 510, dummy layer 505, and gate dielectric layer 455) having openings 514 therein. In the depicted embodiment, the openings 514 expose the semiconductor substrate 210. The openings 514 have a length that extends in a direction perpendicular with a length of the gate stack 450, and a width that extends in a direction perpendicular with a width of the gate stack 450.

Figure 20A:
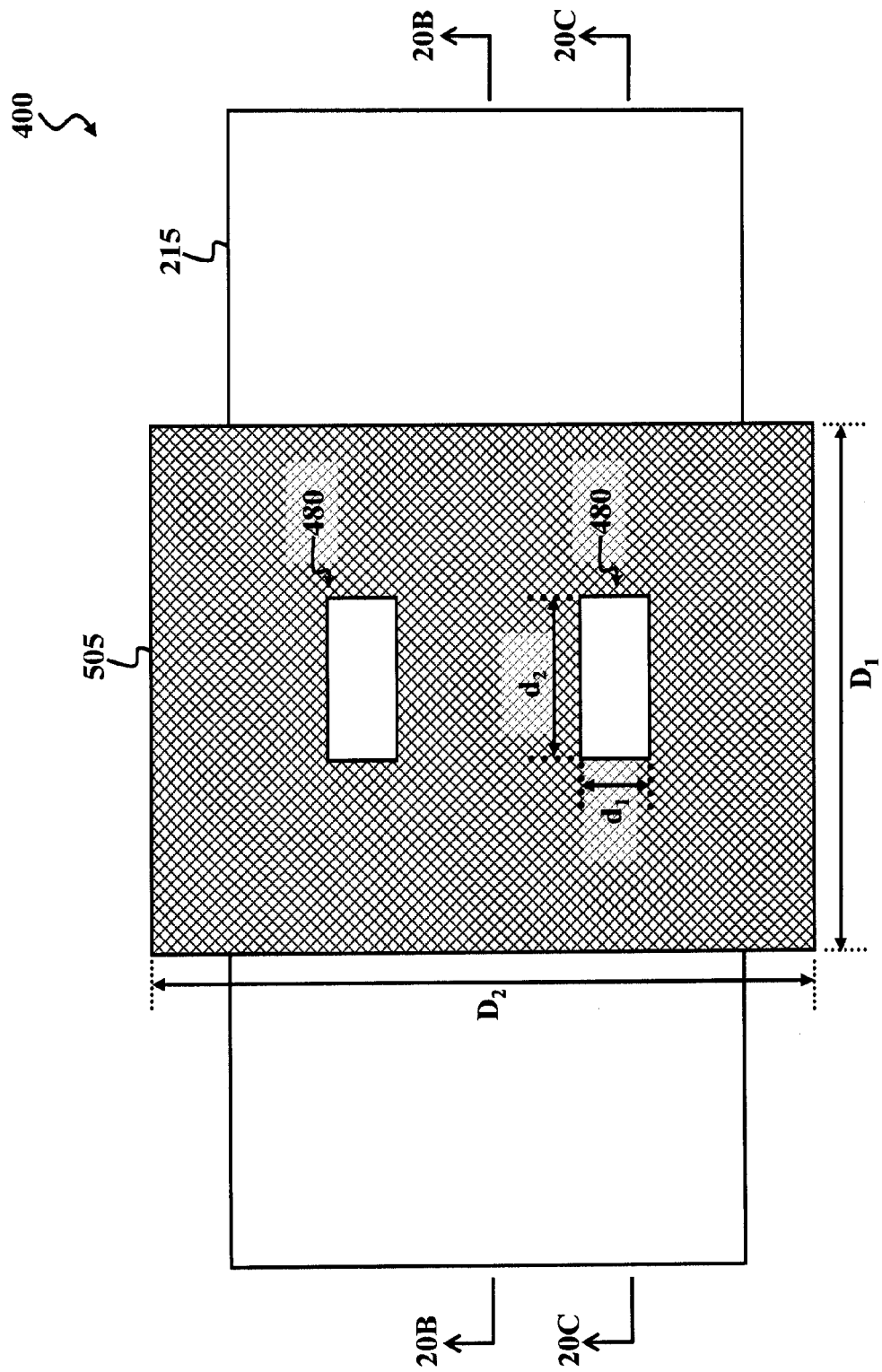
Figure 20B:
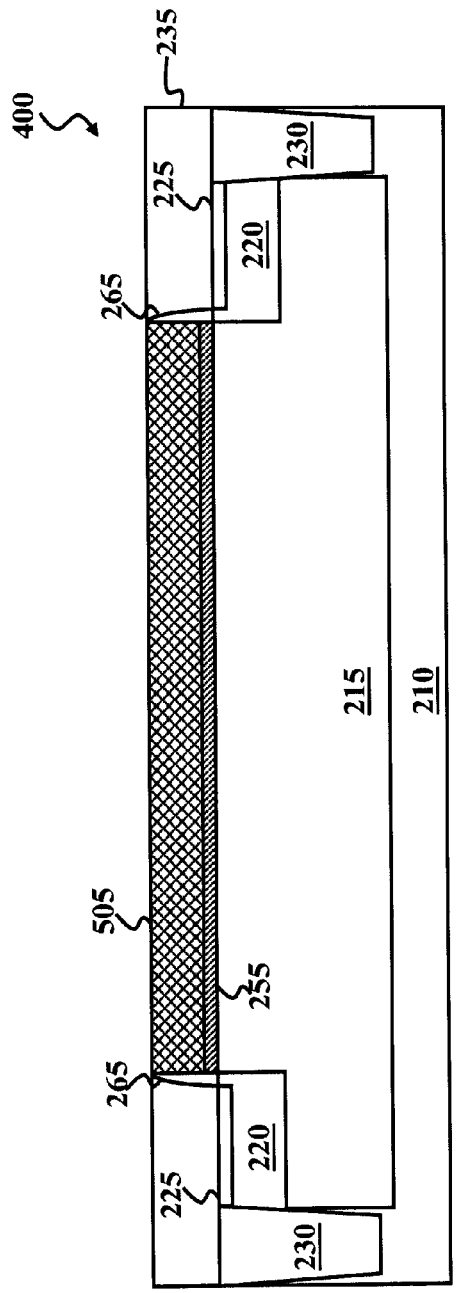
Figure 20C:
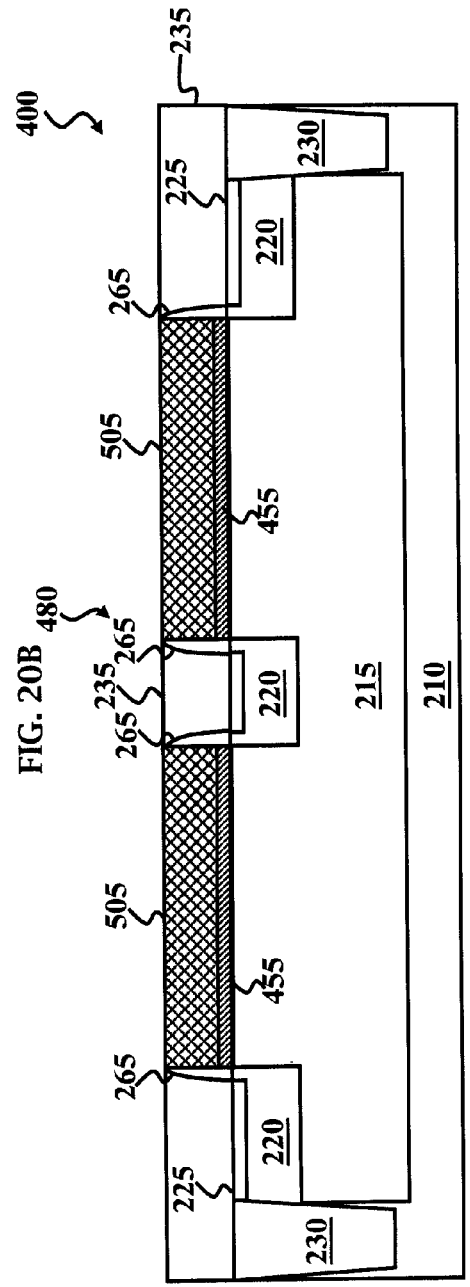

In FIGS. 20A-20C, various features of the transistor 400 are formed by suitable processes. For example, with the hard mask layer 510 remaining over the dummy layer 505 and gate dielectric layer 255, the dielectric features (spacers) 265 are formed as described above. The dielectric features 265 partially fill the opening 514 within the gate stack 450. The doped regions 220 are formed in the substrate 210. The gate stack 450 (including the hard mask layer 510) can be used as a mask for defining areas of the substrate 210 where the doped regions 220 are formed. The silicide features 225 can be formed by a self-aligned salicide process. Thereafter, the hard mask layer 510 is removed, and the dielectric layer 235 is formed over the substrate 210. The dielectric layer 235 fills the remaining opening 514, such that the post features 480 (including the dielectric features 265 and dielectric layer 235) are formed in the opening 514 of the gate stack 450. A chemical mechanical polishing process may be implemented to planarize the dielectric layer 235.

Figure 21A:
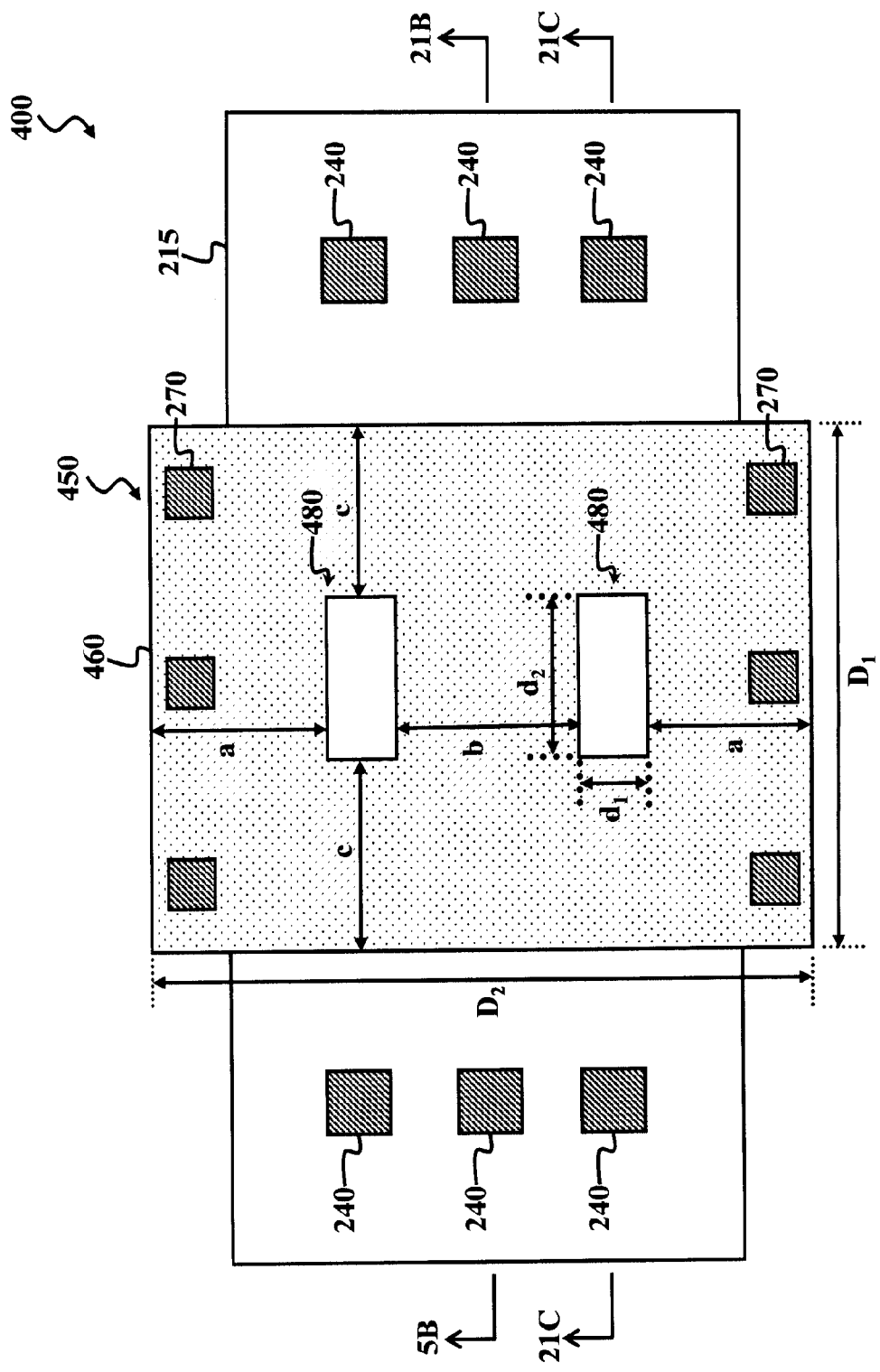

In FIGS. 21A-21C, the dummy layer 505 is replaced with the gate electrode 460, such that the gate stack 450 includes the gate dielectric layer 255 and the gate electrode 460. For example, the dummy layer 505 is removed, by an etching process for example, from the gate stack 450, leaving an opening therein, which is filled with a metal layer. In an example, the metal layer includes a material having a p-type work function (in other words, a p-metal). Alternatively, the metal layer includes a material having an n-type work function. A chemical mechanical polishing process is used to planarize the metal layer, thereby forming the gate electrode 460. During the chemical mechanical polishing process, the post features 480 can retard the polishing process to prevent dishing in the gate electrode 460. Thereafter, the contacts 240 and 275 are formed by a suitable process, such as those described herein. It is noted that the gate electrode 460 may be subjected to another polishing process, such as a chemical mechanical polishing process used to planarize a metal layer of an n-type MOS transistor. The post features 480 again act to retard the polishing process to prevent dishing in the gate electrode 460.

The devices and processes described herein are fully compatible with conventional integrated circuit devices and manufacturing, and thus, the devices and processes described herein can be implemented without adding additional manufacturing costs. As noted above, by embedding the post features described herein into devices, dishing in electrodes (such as metal electrodes) can be reduced or eliminated. This can improve device performance, for example, by preserving a height of the electrodes. Further, the post features provide minimal impact on device performance. Different embodiments may have different advantages, and no particular advantage is necessarily required of any embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a doped region in a semiconductor substrate;
    forming a material layer stack having an opening therein over the doped region, wherein the forming the material layer stack having the opening therein over the doped region includes:
        forming a gate dielectric layer over the semiconductor substrate;
        forming a polysilicon layer over the gate dielectric layer; and
        patterning the polysilicon layer and the gate dielectric layer to form the gate stack over the doped region, wherein the polysilicon layer and the gate dielectric layer have the opening therein;
    forming a post feature in the opening of the material layer stack; and
    replacing a dummy layer of the material layer stack with a metal layer.

2. The method of claim 1, wherein the forming the post feature in the opening of the material layer stack includes:

forming spacers for the gate stack, wherein the spacers partially fill the opening; and forming a dielectric layer over the semiconductor substrate, wherein the dielectric layer fills the opening.

3. The method of claim 1, wherein the replacing the dummy layer of the material layer stack with the metal layer includes performing a chemical mechanical polishing process.

4. The method of claim 1, wherein the forming the post feature in the opening of the material layer stack includes filling the opening with a dielectric material.

5. The method of claim 1, wherein the metal layer is an electrode of a capacitor and the post feature is embedded in the electrode.

6. The method of claim 1, wherein the post feature has a top surface that is substantially planar with a top surface of the metal layer.

7. A method of forming a capacitor, the method comprising:

forming a doped region in a semiconductor substrate;

forming a dielectric layer over the semiconductor substrate;

forming an post feature over the semiconductor substrate; and forming an electrode over the semiconductor substrate such that the post feature is embedded in the electrode, wherein the post feature has a top surface that is substantially planar with a top surface of the electrode.

8. The method of claim 7, further comprising:

removing a portion of the dielectric layer to expose a portion of the semiconductor substrate; and wherein forming the post feature over the semiconductor substrate includes forming the post feature directly over the exposed portion of the semiconductor substrate.

9. The method of claim 7, wherein forming the post feature over the semiconductor substrate includes forming the post feature on the dielectric layer such that the post feature physically contacts the dielectric layer.

10. The method of claim 7, further comprising: forming a polysilicon layer on the dielectric layer prior to forming the electrode; and wherein forming the post feature includes patterning the polysilicon layer such that the patterned polysilicon layer forms the post feature.

11. The method of claim 7, further comprising:

forming a polysilicon layer on the dielectric layer prior to forming the electrode;

patterning the polysilicon layer and the dielectric layer to form an opening that exposes a portion of the semiconductor substrate; and wherein forming the post feature includes forming a dielectric material within the opening.

12. The method of claim 11, further comprising removing the patterned polysilicon layer prior to forming the electrode over the semiconductor substrate.

13. The method of claim 7, wherein the post feature includes a dielectric material.

14. The method of claim 7, wherein the post feature includes a conductive material.

15. A method of forming a capacitor, the method comprising:

forming a dielectric layer over a semiconductor substrate;

forming a conductive layer directly on the dielectric layer;

patterning the conductive layer to form openings that expose portions of the dielectric layer; and forming an electrode material layer within the openings such that the conductive layer is embedded within the electrode material layer.

16. The method of claim 15, wherein the conductive layer includes polysilicon.

17. The method of claim 15, further comprising forming a doped region in the semiconductor substrate.

18. The method of claim 15, further comprising performing a chemical mechanical polishing process on the electrode material layer such that a top surface of the electrode material layer is substantially planar with a top surface of the patterned conductive layer after the performing of the chemical mechanical polishing process.

19. The method of claim 15, wherein patterning the conductive layer to form openings that expose portions of the dielectric layer includes performing an etching process to remove portions of the conductive layer.

20. The method of claim 15, wherein the electrode material layer includes a metal material.

* * * * *